US012610663B2

(12) United States Patent
Bae et al.

(10) Patent No.: US 12,610,663 B2
(45) Date of Patent: Apr. 21, 2026

(54) DISPLAY DEVICE WITH IMPROVED CONNECTING RESISTANCE BETWEEN ELECTRODES AND METHOD OF MANUFACTURING THE SAME

(71) Applicant: Samsung Display Co., LTD., Yongin-si (KR)

(72) Inventors: Sung Geun Bae, Hwaseong-si (KR); Da Sol Jeong, Seoul (KR); Su Min Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 787 days.

(21) Appl. No.: 17/944,285

(22) Filed: Sep. 14, 2022

(65) Prior Publication Data

US 2023/0246135 A1      Aug. 3, 2023

(30) Foreign Application Priority Data

Feb. 3, 2022    (KR) ........................ 10-2022-0014145

(51) Int. Cl.
*H10H 29/14* (2025.01)
*H10H 20/01* (2025.01)
(Continued)

(52) U.S. Cl.
CPC ........ *H10H 20/8312* (2025.01); *H10H 20/01* (2025.01); *H10H 20/857* (2025.01);
(Continued)

(58) Field of Classification Search
CPC ............. H10H 20/8312; H10H 20/857; H10H 29/142; H10H 20/0364; H10H 20/831; H10D 86/021; H10D 86/441
(Continued)

(56) References Cited

U.S. PATENT DOCUMENTS

2002/0180898 A1* 12/2002 Yoo ........................ G02F 1/1368
                                                              349/43
2011/0031500 A1* 2/2011 Suh ....................... H10K 50/814
                                                              257/59
(Continued)

FOREIGN PATENT DOCUMENTS

KR      10-2019-0121894      10/2019

*Primary Examiner* — David Chen
(74) *Attorney, Agent, or Firm* — Womble Bond Dickinson (US) LLP

(57) ABSTRACT

A display device comprises a first conductive layer on a substrate including gate electrodes and 1-1th and 2-1th connecting conductive patterns; a second conductive layer on the first conductive layer including source electrodes and drain electrodes and 1-2th and 2-2th connecting conductive patterns; bank patterns on the second conductive layer, extending in first and second directions intersecting each other, and surrounding subpixels; a first electrode on a first bank pattern disposed in each of the subpixels to extend in the first direction; second electrodes on second bank patterns spaced apart from each other with the first electrode being disposed between the second electrodes and extending in the first direction; light-emitting elements disposed on the first electrode and the second electrodes; a first connecting electrode disposed on the first electrode and contacting first light-emitting elements; and a second connecting electrode disposed on the second electrodes and contacting the second light-emitting elements.

20 Claims, 27 Drawing Sheets

(51) Int. Cl.
    *H10H 20/831*     (2025.01)
    *H10H 20/857*     (2025.01)

(52) U.S. Cl.
    CPC ......... *H10H 29/142* (2025.01); *H10H 20/032*
             (2025.01); *H10H 20/0364* (2025.01)

(58) Field of Classification Search
    USPC ................ 257/40, 59, 72, E51.001, E51.018
    See application file for complete search history.

(56) References Cited

U.S. PATENT DOCUMENTS

2021/0391381 A1* 12/2021 Asada .................. H10H 20/833
2023/0197764 A1*  6/2023 Lee ........................ H10H 20/01
                                                      257/79
2024/0306418 A1*  9/2024 Wang .................... H10K 50/11

\* cited by examiner

RME: RME1, RME2
CNE: CNE1, CNE2, CNE3, CNE4, CNE5
ED: ED1, ED2

RME: RME1, RME2
CNE: CNE1, CNE2, CNE3
ED: ED1, ED2

DCL1: DCL11, DCL12
RME: RME1, RME2

DCL2: DCL21, DCL22

DCL1: DCL11, DCL12

DCL22
IL1
DCL21
GI
BL
SUB

N3                                    N3'

DR3

DR2

DCL2: DCL21, DCL22

VIA

PV1
DCL12

IL1
DCL11
GI
BL

SUB

N2

N2'

DR3

DR2

DCL1: DCL11, DCL12

DCL2: DCL21, DCL22

DCL1: DCL11, DCL12
RME: RME1, RME2

DCL2: DCL21, DCL22

DCL1: DCL11, DCL12
RME: RME1, RME2

DCL2: DCL21, DCL22

RME: RME1, RME2

RME1          CNE1

PAS2
PAS1
VIA
PV1
IL1
DCL21_1
GI
BL
SUB

CT3          CT4_1

DR3

DR2

DCL1: DCL11, DCL12
RME: RME1, RME2

DCL2: DCL21, DCL22

DISPLAY DEVICE WITH IMPROVED CONNECTING RESISTANCE BETWEEN ELECTRODES AND METHOD OF MANUFACTURING THE SAME

CROSS-REFERENCE TO RELATED APPLICATION(S)

This application claims priority to and benefits of Korean Patent Application No. 10-2022-0014145 under 35 U.S.C. § 119, filed on Feb. 3, 2022, in the Korean Intellectual Property Office (KIPO), the entire contents of which are incorporated herein by reference.

BACKGROUND

1. Technical Field

The disclosure relates to a display device and a method of manufacturing the same.

2. Description of the Related Art

Display devices are becoming more important with developments in multimedia technology. Accordingly, various display devices such as an organic light-emitting diode (OLED) display device, a liquid crystal display (LCD) device, and the like have been used.

There are self-luminous display devices including light-emitting elements. Examples of the self-luminous display devices include an organic light-emitting display device using an organic material as a light-emitting material or an inorganic light emitting display device using an inorganic material as a light-emitting material.

SUMMARY

Aspects of the disclosure provide a display device capable of improving resistance by using separate conductive patterns, instead of directly connecting first or second electrodes and connecting electrodes.

However, aspects of the disclosure are not restricted to those set forth herein. The above and other aspects of the disclosure will become more apparent to one of ordinary skill in the art to which the disclosure pertains by referencing the detailed description of the disclosure given below.

According to an aspect of the disclosure, there may be provided a display device, the display device may comprise a first conductive layer on a substrate including gate electrodes of transistors and 1-1th and 2-1th connecting conductive patterns; a second conductive layer on the first conductive layer including source electrodes and drain electrodes of the transistors and 1-2th and 2-2th connecting conductive patterns; bank patterns on the second conductive layer, extending in first and second directions intersecting each other, surrounding subpixels, and including a first bank pattern and second bank patterns; a first electrode on the first bank pattern disposed in each of the subpixels to extend in the first direction; second electrodes on the second bank patterns spaced apart from each other in the second direction with the first electrode being disposed between the second electrodes and extending in the first direction; light-emitting elements disposed on the first electrode and the second electrodes and including first light-emitting elements and second light-emitting elements; a first connecting electrode disposed on the first electrode and electrically contacting the first light-emitting elements; and a second connecting electrode disposed on the second electrodes and electrically contacting the second light-emitting elements, wherein the first electrode may be directly connected to the 2-1th connecting conductive pattern through a first contact hole, and the second electrodes may be directly connected to the 1-1th connecting conductive pattern through second contact holes.

The first conductive layer may include copper (Cu).

The 1-1th and 2-1th connecting conductive patterns may include copper (Cu).

The first connecting electrode may be directly connected to the 2-2th connecting conductive pattern through a third contact hole, and the second connecting electrode may be directly connected to the 1-2th connecting conductive pattern through a fourth contact hole.

The second conductive layer and the first conductive layer may include a same material.

The 1-2th and 2-2th connecting conductive patterns may include copper (Cu).

The display device may further comprise an interlayer insulating layer on the first conductive layer; and a passivation layer on the interlayer insulating layer and the second conductive layer.

The display device may further comprise a via layer between the second conductive layer and the first electrode and between the second conductive layer and the second electrodes.

The first contact hole and the second contact holes may penetrate the via layer, the passivation layer, and the interlayer insulating layer.

The display device may further comprise a first insulating layer on the first electrode and the second electrodes; and a second insulating layer on the first insulating layer.

The third and fourth contact holes may penetrate the first insulating layer, the second insulating layer, the via layer, and the passivation layer.

The 1-1th and 1-2th connecting conductive patterns may be directly connected to each other.

The 2-1th and 2-2th connecting conductive patterns may be directly connected to each other.

A low-potential voltage may be applied to the 1-1th connecting conductive pattern, and a high-potential voltage may be applied to the 2-1th connecting conductive pattern.

According to an aspect of the disclosure, there may be provided a method of manufacturing a display device, the method of manufacturing a display device, may comprise forming a first conductive layer including gate electrodes of transistors and 1-1th and 2-1th connecting conductive patterns, on a substrate; forming a second conductive layer including source electrodes and drain electrodes of the transistors and 1-2th and 2-2th connecting conductive patterns, on the first conductive layer; forming bank patterns, extending in first and second directions intersecting each other, surrounding subpixels, and including a first bank pattern and second bank patterns, on the second conductive layer; forming a first electrode disposed in each of the subpixels to extend in the first direction, and second electrodes spaced apart from each other in the second direction with the first electrode being disposed between the second electrodes and extending in the first direction, on the bank pattern; forming light-emitting elements including first light-emitting elements and second light-emitting elements, on the first electrode and the second electrodes; forming a first connecting electrode electrically contacting the first light-emitting elements, on the first electrode; and forming a second connecting electrode electrically contacting the second light-emitting elements, on the second electrodes, wherein the first electrode may be directly connected to the 2-1th connecting conductive pattern through a first contact hole, and the second electrodes may be directly connected to the 1-1th connecting conductive pattern through second contact holes.

The 1-1th and 2-1th connecting conductive patterns may include copper (Cu).

The first connecting electrode may be directly connected to the 2-2th connecting conductive pattern through a third contact hole, and the second connecting electrode may be directly connected to the 1-2th connecting conductive pattern through a fourth contact hole.

The second conductive layer and the first conductive layer may include a same material.

The 1-1th and 1-2th connecting conductive patterns may be directly connected to each other, and the 2-1th and 2-2th connecting conductive patterns may be directly connected to each other.

A low-potential voltage may be applied to the 1-1th connecting conductive pattern, and a high-potential voltage may be applied to the 2-1th connecting conductive pattern.

According to the aforementioned and other embodiments of the disclosure, resistance can be improved by using separate conductive patterns, instead of directly connecting first and second electrodes and connecting electrodes.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
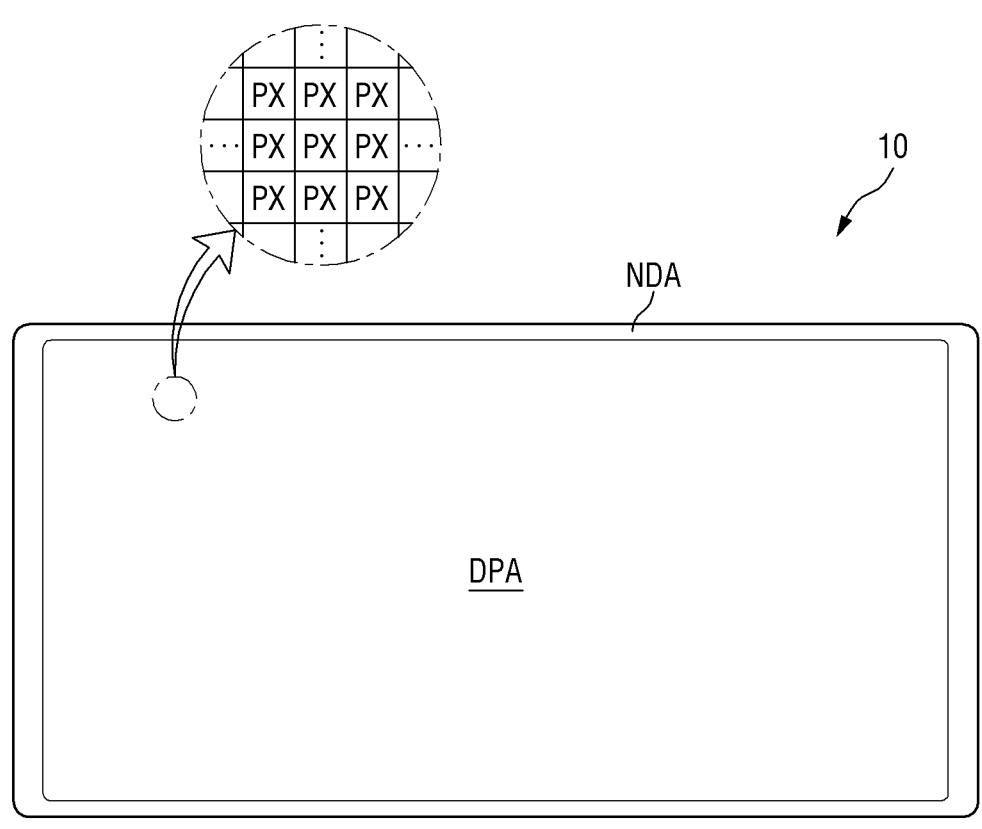
FIG. 1 is a schematic plan view of a display device according to an embodiment of the disclosure.
Figure 1:
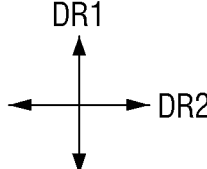

Specific structural and functional descriptions of embodiments of the disclosure herein are only for illustrative purposes of the embodiments of the disclosure. The disclosure may be embodied in many different forms without departing from the spirit and significant characteristics of the disclosure. Therefore, the embodiments of the disclosure are disclosed only for illustrative purposes and should not be construed as limiting the disclosure. For example, the disclosure is only defined by the scope of the claims.

It will be understood that in case that an element is referred to as being related to another element such as being "coupled" or "connected" to another element, it can be directly coupled or connected to the other element or intervening elements may be therebetween. In contrast, it should be understood that in case that an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to include both the singular and plural, unless the context clearly indicates otherwise. For example, an element" has the same meaning as "at least one element" unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" in case that used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

The term "overlap" or "at least partially overlap" as used herein may mean that at least part of a first object faces at least part of a second object in a given direction or given view.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the attached drawings.

FIG. 1 is a schematic plan view of a display device according to an embodiment of the disclosure.

Referring to FIG. 1, a display device 10 may display a moving or still image. The display device 10 may refer to nearly all types of electronic devices that provide a display image. Examples of the display device 10 may include a television (TV), a notebook computer, a monitor, a billboard, Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, or the like.

The display device 10 may include a display panel that provides a display image. Examples of the display panel of the display device 10 may include an inorganic light-emitting diode (ILED) display panel, an organic light-emitting diode (OLED) display panel, a quantum-dot light-emitting diode (QLED) display panel, a plasma display panel (PDP), a field-emission display (FED) panel, or the like. The display panel of the display device 10 will hereinafter be described as being, for example, an ILED display panel, but the disclosure is not limited thereto. For example, various other display panels may also be applicable to the display panel of the display device 10.

A shape of the display device 10 may vary. For example, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. A shape of a display area DPA of the display device 10 may be similar to the shape of the display device 10. FIG. 1 may illustrate that the display device 10 and the display area DPA both have a rectangular shape that extends in a second direction DR2.

The display device 10 may include the display area DPA and a non-display area NDA. The display area DPA may be an area in which an image is displayed, and the non-display area NDA may be an area in which an image is not displayed. The display area DPA may also be referred to as an active area, and the non-display area NDA may also be referred to as an inactive area. The display area DPA may occupy a middle part of the display device 10.

The display area DPA may include pixels PX. The pixels PX may be arranged in row and column directions. Each of the pixels PX may have a rectangular or square shape in a plan view, but the disclosure is not limited thereto. As another example, each of the pixels PX may have a rhombus shape having sides inclined with respect to a particular direction. The pixels PX may be arranged in a stripe or an island fashion. Each of the pixels PX may include one or more light-emitting elements ED, which emit light of a particular wavelength range.

The non-display area NDA may be disposed around the display area DPA. The non-display area NDA may surround an entire display area DPA or part of the display area DPA. The display area DPA may have a rectangular shape, and the non-display area NDA may be disposed adjacent to four sides of the display area DPA. The non-display area NDA may form a bezel of the display device 10. Lines or circuit drivers included in the display device 10 may be disposed in the non-display area NDA, or external devices may be mounted in the non-display area NDA.

Figure 2:
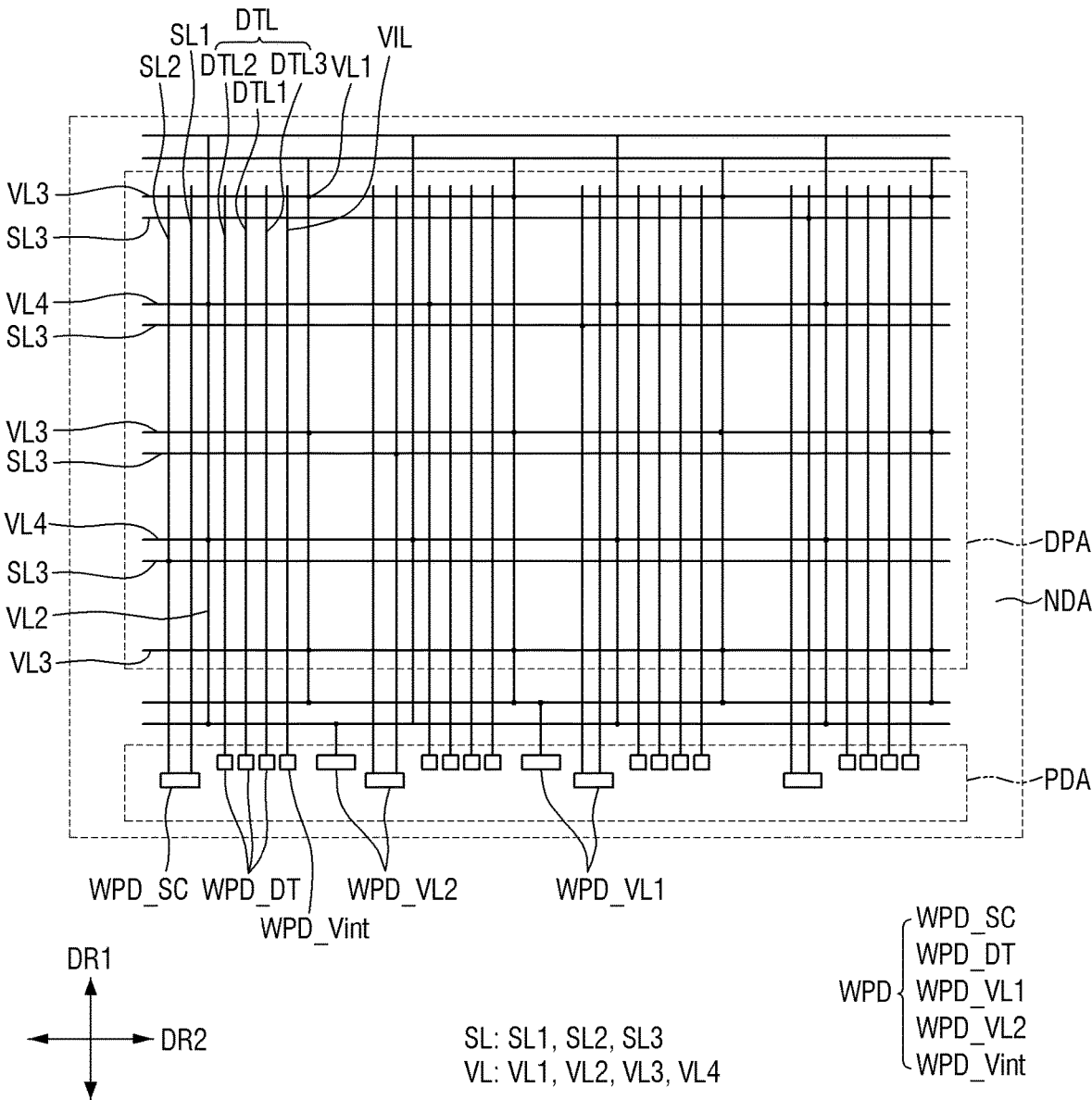
FIG. 2 is a schematic plan view illustrating the layout of lines in the display device.

FIG. 2 is a schematic plan view illustrating the layout of lines in the display device.

Referring to FIG. 2, the display device 10 may include lines. The display device 10 may include scan lines SL (e.g., first, second, and third scan lines SL1, SL2, and SL3), data lines DTL (e.g., first, second, and third data lines DTL1, DTL2, and DTL3), an initialization voltage lines VIL, and voltage lines VL (e.g., first, second, third, and fourth voltage lines VL1, VL2, VL3, and VL4). Although not specifically illustrated, the display device 10 may further include other lines (the other lines may be further disposed the display device 10). The lines of the display device 10 may include lines that are formed of a first conductive layer and extend in a first direction DR1, lines that are formed of a third conductive layer and extend in the second direction DR2, but the disclosure is not limited thereto.

First scan lines SL1 and second scan lines SL2 may extend in the first direction DR1. A set of the first and second scan lines SL1 and SL2 may be disposed adjacent to each other, and may be spaced apart from other sets of first and second scan lines SL1 and SL2 in the second direction DR2. The first scan lines SL1 and the second scan lines SL2 may be electrically connected to scan line wire pads WPD_SC, which are connected to a scan driver (not illustrated). The first scan lines SL1 and the second scan lines SL2 may extend from a pad area PDA in the non-display area NDA to the display area DPA.

Third scan lines SL3 may extend in the second direction DR2, and may be spaced apart from one another in the first direction DR1. Each of the third scan lines SL3 may be electrically connected to one or more first scan lines SL1 or one or more second scan lines SL2. The scan lines SL may form a mesh structure over the entire display area DPA, but the disclosure is not limited thereto.

The term "connect" or "connection", as used herein, not only may mean that an element is coupled to another element through physical contact, but also may mean that an element is coupled to another element via yet another element. An integral member may be understood as having parts connected to one another. Also, the connection between two elements may encompass not only a direct connection between the two elements, but also an electrical connection between the two elements.

The data lines DTL may extend in the first direction DR1. The data lines DTL may include first data lines DTL1, second data lines DTL2, and third data lines DTL3, and one first data line DTL1, a second data line DTL2, and a third data line DTL3 may be paired together to be disposed adjacent to one another. The data lines DTL may extend from the pad area PDA in the non-display area NDA to the display area DPA. However, the disclosure is not limited to this. As another example, the data lines DTL may be arranged at equal intervals between first voltage lines VL1 and second voltage lines VL2.

The initialization voltage lines VIL may extend in the first direction DR1. The initialization voltage lines VIL may be disposed between the data lines DTL and the first voltage lines VL1. The initialization voltage lines VIL may extend from the pad area PDA in the non-display area NDA to the display area DPA.

The first voltage lines VL1 and the second voltage lines VL2 may extend in the first direction DR1, and third voltage lines VL3 and fourth voltage lines VL4 may extend in the second direction DR2. The first voltage lines VL1 and the second voltage lines VL2 may be alternately arranged in the second direction DR2, and the third voltage lines VL3 and the fourth voltage lines VL4 may be alternately arranged in the first direction DR1. The first voltage lines VL1 and the second voltage lines VL2 may extend in the first direction DR1 across the display area DPA. Some of the third voltage lines VL3 and some of the fourth voltage lines VL4 may be disposed in the display area DPA, and the other third voltage lines VL3 and the other fourth voltage lines VL4 may be disposed in the non-display area NDA, on sides, in the first direction DR1, of the display area DPA. The first voltage lines VL1 and the second voltage lines VL2 may be formed of the first conductive layer, and the third voltage lines VL3 and the fourth voltage lines VL4 may be formed of the third conductive layer, which is disposed on a different layer from the first conductive layer. Each of the first voltage lines VL1 may be electrically connected to one or more third voltage lines VL3, and each of the second voltage lines VL2 may be electrically connected to one or more fourth voltage lines VL4. The voltage lines VL may form a mesh structure over the entire display area DPA. However, the disclosure is not limited to this.

Each of the first scan lines SL1, the second scan lines SL2, the data lines DTL, the initialization voltage lines VIL, the first voltage lines VL1, and the second voltage lines VL2 may be electrically connected to one or more wire pads WPD. The wire pads WPD may be disposed in the non-display area NDA. The wire pads WPD may also be disposed in the pad area PDA on another side, in the first direction DR1, of the display area DPA, e.g., on the lower side of the display area DPA. The first scan lines SL1 and the second scan lines SL2 may be electrically connected to the scan line wire pads WPD_SC, and the data lines DTL may be electrically connected to different data line wire pads WPD_DT. The initialization voltage lines VIL may be electrically connected to initialization line wire pads WPD_Vint, the first voltage lines VL1 may be electrically connected to first voltage line wire pads WPD_VL1, and the second voltage lines VL2 may be electrically connected to second voltage line wire pads WPD_VL2. External devices may be mounted on the wire pads WPD. The external devices may be mounted on the wire pads WPD via anisotropic conductive films or ultrasonic bonding. The wire pads WPD are illustrated as being disposed in the pad area PDA on a lower side of the display area DPA, but the disclosure is not limited thereto. As another example, some of the wire pads WPD may be disposed on an upper side of the display area DPA or on a left or right side of the display area DPA.

A pixel PX or a subpixel SPXn (where n is an integer of 1 to 3) of the display device 10 may include a pixel driving circuit. The above-described lines of the display device 10 may apply driving signals to the pixel driving circuit, passing by the pixel or the subpixel SPXn. The pixel driving circuit may include transistors and capacitors. The numbers of transistors and capacitors included in the pixel driving circuit may vary. For example, the pixel driving circuit may have a "3T1C" structure including three transistors and one capacitor. The pixel driving circuit will hereinafter be described as having the "3T1C" structure, but the disclosure is not limited thereto. As another example, various other structures such as a "2T1C", "7T1C", or "6T1C" structure may also be applicable to the pixel driving circuit.

Figure 3:
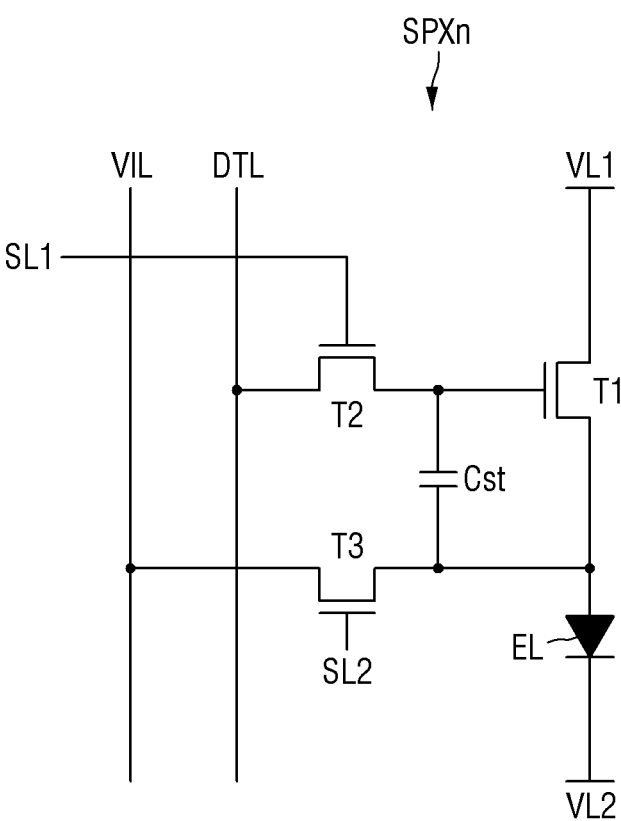
FIGS. 3 and 4 are schematic diagram of an equivalent circuit of subpixels of the display device.
Figure 4:
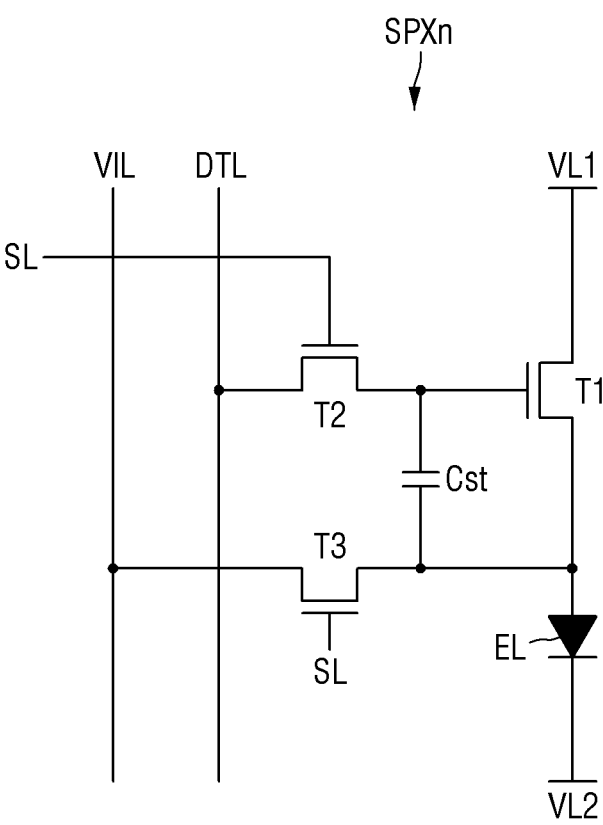

FIGS. 3 and 4 are schematic diagram of an equivalent circuit of subpixels of the display device.

Referring to FIG. 3, a subpixel SPXn of the display device 10 may include a light-emitting diode (LED) EL, three transistors, i.e., first, second, and third transistors T1, T2, and T3, and one storage capacitor Cst.

The LED EL may emit light in accordance with a current applied thereto via the first transistor T1. The LED EL may include a first electrode, a second electrode, and at least one light-emitting element disposed between the first and second electrodes. The light-emitting element may emit light of a particular wavelength range in accordance with electric signals transmitted thereto from the first and second electrodes.

A first end of the LED EL may be electrically connected to a source electrode of the first transistor T1, and a second end of the LED EL may be electrically connected to a second voltage line VL2, to which a low-potential voltage (hereinafter, a second power supply voltage) is supplied. Here, the second power supply voltage is lower than a high-potential voltage (hereinafter, a first power supply voltage), which is supplied to a first voltage line VL1.

The first transistor T1 may control a current flowing from the first voltage line VL1, to which the first power supply voltage is supplied, to the LED EL in accordance with a difference in voltage between a gate electrode and the source electrode of the first transistor T1. For example, the first transistor T1 may be a driving transistor for driving the LED EL. The gate electrode of the first transistor T1 may be electrically connected to a source electrode of the second transistor T2, the source electrode of the first transistor T1 may be electrically connected to a first electrode of the LED EL, and a drain electrode of the first transistor T1 may be electrically connected to the first voltage line VL1, to which the first power supply voltage is supplied.

The second transistor T2 is turned on by a scan signal from a first scan line SL1 to connect a data line DTL to the gate electrode of the first transistor T1. A gate electrode of the second transistor T2 may be electrically connected to the first scan line SL1, the source electrode of the second transistor T2 may be electrically connected to the gate electrode of the first transistor T1, and a drain electrode of the second transistor T2 may be electrically connected to the data line DTL.

The third transistor T3 is turned on by a second scan signal from a second scan line SL2 to connect an initialization voltage line VIL to the end of the LED EL. A gate electrode of the third transistor T3 may be electrically connected to the second scan line SL2, a drain electrode of the third transistor T3 may be electrically connected to the initialization voltage line VIL, a source electrode of the third transistor T3 may be electrically connected to the end of the LED EL or the source electrode of the first transistor T1.

The source electrodes and the drain electrodes of the first, second, and third transistors T1, T2, and T3 are not limited to the above descriptions. The first, second, and third transistors T1, T2, and T3 may be formed as thin-film transistors (TFTs). FIG. 3 illustrates that the first, second, and third transistors T1, T2, and T3 are formed as N-type metal-oxide semiconductor field-effect transistors (MOSFETs), but the disclosure is not limited thereto. As another example, the first, second, and third transistors T1, T2, and T3 may all be formed as P-type MOSFETs. Yet as another example, some of the first, second, and third transistors T1, T2, and T3 may be formed as N-type MOSFETs, and the other transistor(s) may be formed as P-type MOSFETs.

The storage capacitor Cst may be formed between the gate electrode and the source electrode of the first transistor T1. The storage capacitor Cst may store a differential voltage corresponding to the difference in voltage between the gate electrode and the source electrode of the first transistor T1.

In the embodiment of FIG. 3, the gate electrode of the second transistor T2 may be electrically connected to the first scan line SL1, and the gate electrode of the third transistor T3 may be electrically connected to the second scan line SL2. The first and second scan lines SL1 and SL2 may be different scan lines, and the second and third transistors T2 and T3 may be turned on by scan signals from different scan lines. However, the disclosure is not limited to this.

Referring to FIG. 4, the gate electrodes of second and third transistors T2 and T3 may be electrically connected to a same scan line SL. The second and third transistors T2 and T3 may be turned on at a same time by a scan signal from the same scan line SL.

A structure of a pixel PX of the display device 10 will hereinafter be described in further detail.

Figure 5:
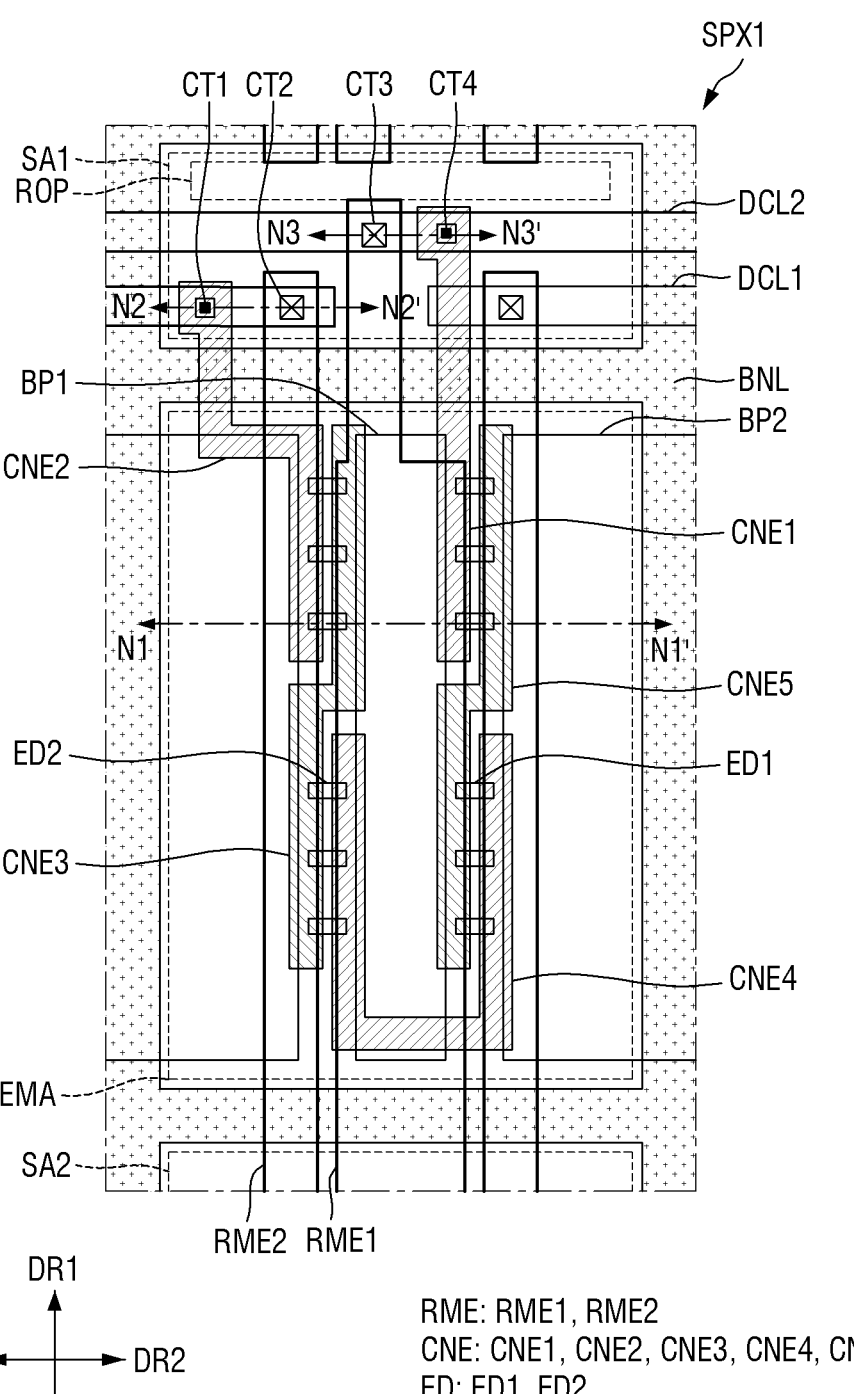
FIG. 5 is a schematic plan view of a first subpixel of the display device.
Figure 6:
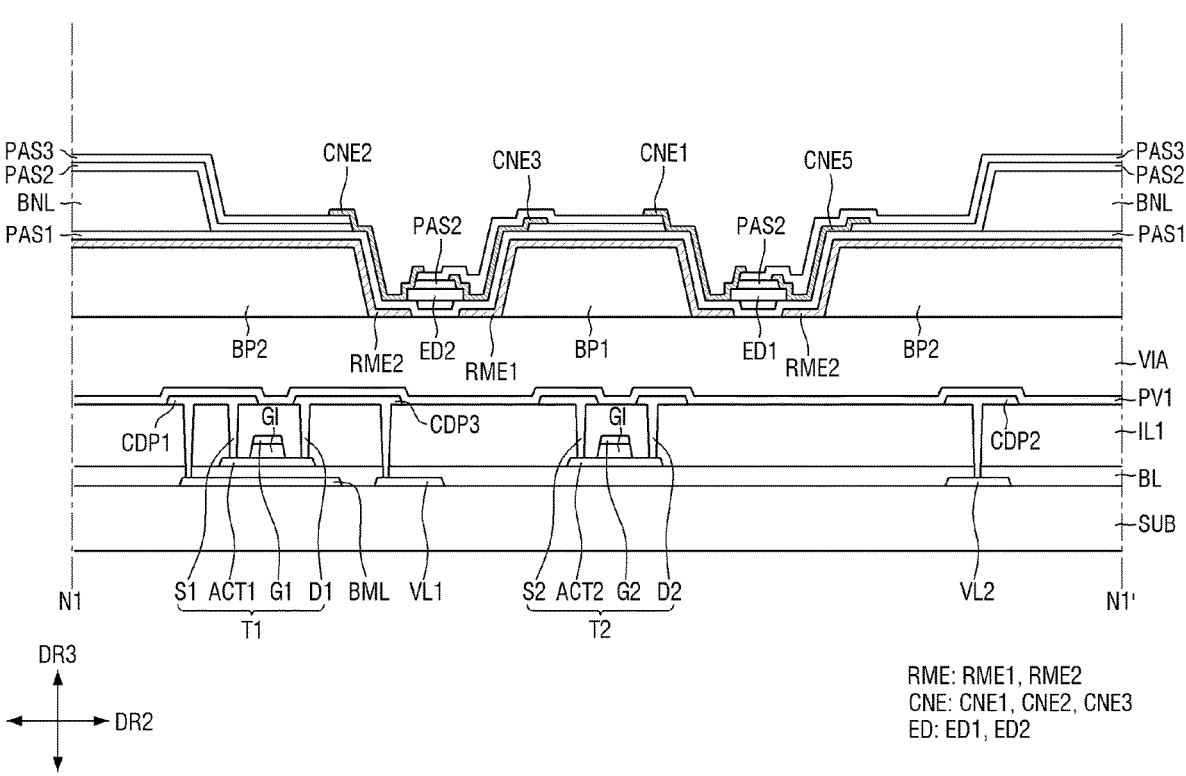
FIG. 6 is a schematic cross-sectional view taken along line N1-N1' of FIG. 5.
Figure 7:
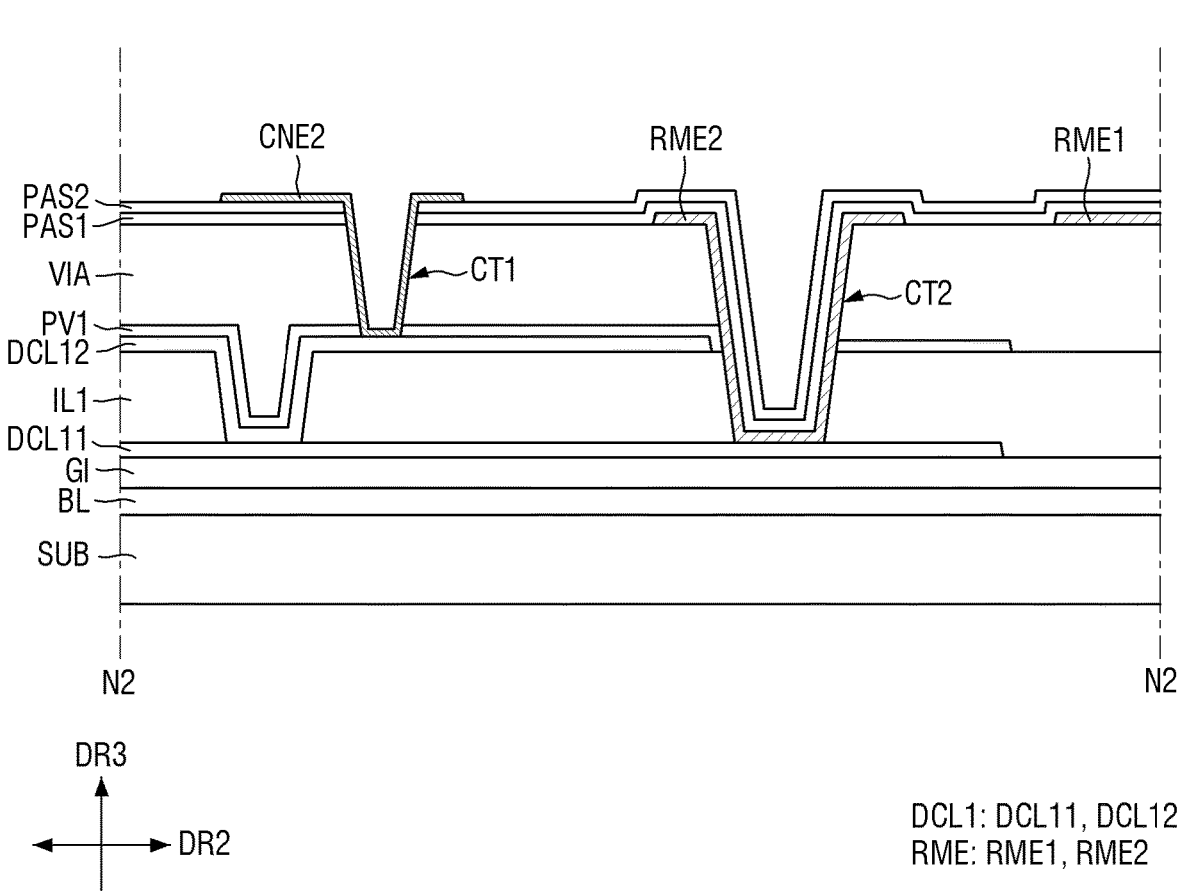
FIG. 7 is a schematic cross-sectional view taken along line N2-N2' of FIG. 5.
Figure 8:
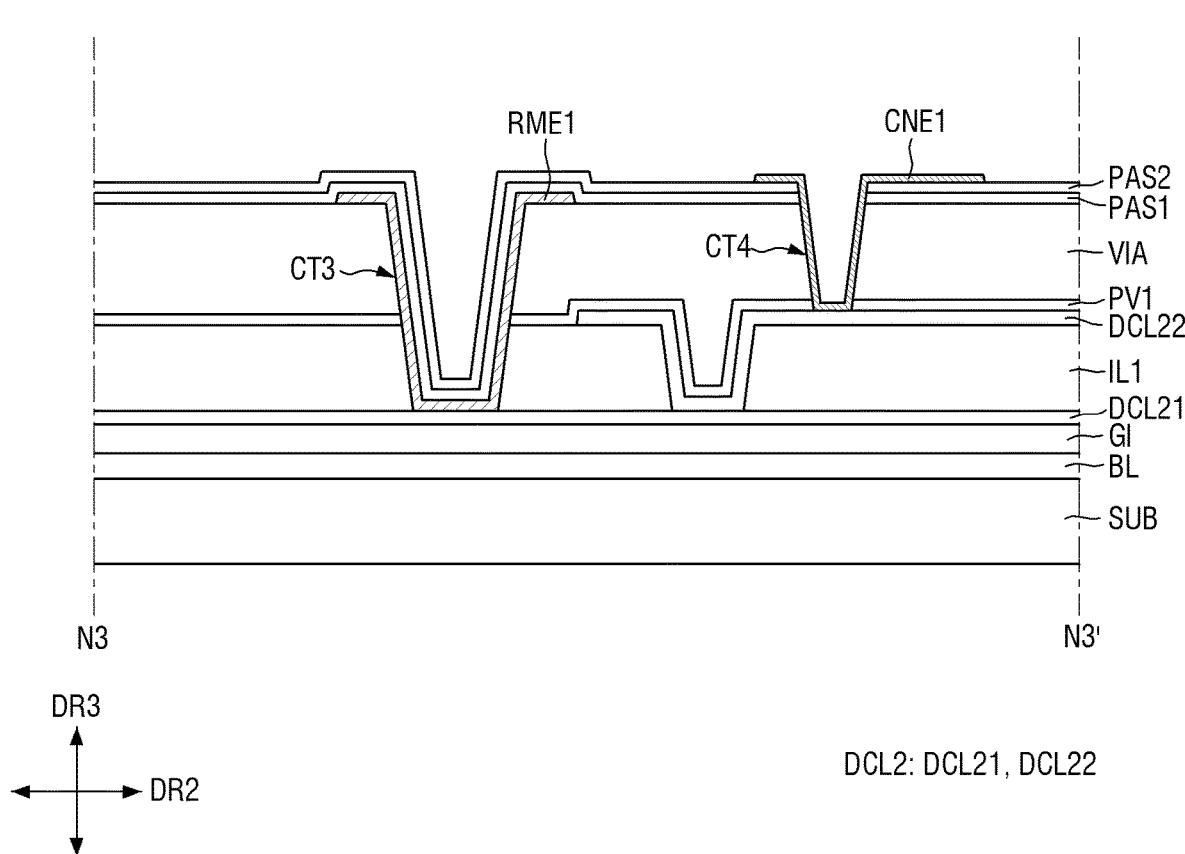
FIG. 8 is a schematic cross-sectional view taken along line N3-N3' of FIG. 5.

FIG. 5 is a schematic plan view of a subpixel of the display device. FIG. 6 is a schematic cross-sectional view taken along line N1-N1' of FIG. 5. FIG. 7 is a schematic cross-sectional view taken along line N2-N2' of FIG. 5. FIG. 8 is a schematic cross-sectional view taken along line N3-N3' of FIG. 5.

FIG. 5 is a schematic plan view of a first subpixel SPX1 of the display device. FIGS. 5 to 8 are schematic plan views or cross-sectional views of the first subpixel SPX1. A structure of second and third subpixels SPX2 and SPX3 may be substantially a same as the structure of the first subpixel SPX1, and thus, illustrations of the second and third subpixels SPX2 and SPX3 are omitted. The first subpixel SPX1 may emit light of a first color, the second subpixel SPX2 may emit light of a second color, and the third subpixel SPX3 may emit light of a third color. For example, the first, second, and third colors may be blue, green, and red, respectively, but the disclosure is not limited thereto. As another example, the first, second, and third subpixels SPX1, SPX2, and SPX3 may all emit light of a same color. For example, the first, second, and third subpixels SPX1, SPX2, and SPX3 may all emit blue light.

The first subpixel SPX1 may include an emission area EMA and a non-emission area. The emission area EMA may be an area that emits light of a particular wavelength range because the presence of light-emitting elements ED (e.g., first, second light-emitting elements ED1, ED2) therein. The non-emission area may be an area that is not reached by light emitted by the light-emitting elements ED and does not output light because an absence of light-emitting elements therein.

The emission area EMA may include a region where an array of light-emitting elements ED is disposed and a region around the array of light-emitting elements ED that outputs light emitted by the array of light-emitting elements ED. For example, the emission area EMA may also include a region that outputs light emitted by the array of light-emitting elements ED and then reflected or refracted by other members. Light-emitting elements ED may be disposed in the first subpixel SPX1, and may form an emission area EMA including a region where the light-emitting elements ED are disposed and the surroundings of the region where the light-emitting elements ED are disposed.

The first subpixel SPX1 may further include subareas SA1 and SA2, which are disposed in the non-emission area. The subareas SA1 and SA2 may include a first subarea SA1, which is disposed on a side, in the first direction DR1, of the emission area EMA, for example, on an upper side of the emission area EMA, and a second subarea SA2, which is disposed on another side, in the first direction DR1, of the emission area EMA, for example, on a lower side of the emission area EMA. Emission areas EMA and subareas SA1 and SA2 may be alternately arranged in the first direction DR1, depending on a layout of pixels PX and first subpixels SPX1, and each first or second subarea SA1 or SA2 may be disposed between two different emission areas EMA spaced apart from each other in the first direction DR1. For example, emission areas EMA may be repeatedly arranged in the first direction DR1 with a first or second subarea SA1 or SA2 interposed therebetween. The emission areas EMA, first subareas SA1, and second subareas SA2 may be repeatedly arranged in the second direction DR2, but the disclosure is not limited thereto. For example, emission areas EMA and subareas SA1 and SA2 may have a different layout from that illustrated in FIG. 5.

The first and second subareas SA1 and SA2 may be areas that are shared by two adjacent first subpixels SPX1 in the first direction DR1. For example, the second subarea SA2 of FIG. 5 may be shared by the first subpixel SPX1 of FIG. 5 and a first subpixel SPX1 (not illustrated) adjacent to the first subpixel SPX1 of FIG. 5 in the first direction DR1. In the first subpixel SPX1 of FIG. 5, the first subarea SA1 may be disposed on the upper side of the emission area EMA, and in a first subpixel SPX1 (not illustrated) adjacent to the first subpixel SPX1 of FIG. 5 in the first direction DR1, the second subarea SA2 may be disposed on the upper side of the emission area EMA.

As no light-emitting elements ED are disposed in the subareas SA1 and SA2 of the first subpixel SPX1 of FIG. 5, the subareas SA1 and SA2 may not emit light, but parts of the electrodes RME (e.g., first, second electrodes RME1, RME2) may be disposed in the subareas SA1 and SA2. The electrodes RME disposed to each of two different subpixels SPXn may be disposed in a separation part ROP of each of subareas SA1 and SA2.

The display device 10 may include, for example, in the first subpixel SPX1 of FIG. 5, electrodes RME, bank patterns BP1 and BP2, a bank layer BNL, light-emitting elements ED, and connecting electrodes CNE (e.g., first, second, third, fourth, and fifth connecting electrodes CNE1, CNE2, CNE3, CNE4, and CNE5).

The bank patterns BP1 and BP2 may be disposed in the emission area EMA of the first subpixel SPX1. The bank patterns BP1 and BP2 may have an extended shape in the first direction DR1, and may have a uniform width in the second direction DR2.

For example, the bank patterns BP1 and BP2 may include a first bank pattern BP1 and second bank patterns BP2, which are disposed in the emission area EMA of the first subpixel SPX1 to be spaced apart from one another in the second direction DR2. The first bank pattern BP1 may be disposed at a center of the emission area EMA, and the second bank patterns BP2 may be disposed to be spaced apart from the first bank pattern BP1 with the first bank pattern BP1 interposed therebetween. The first bank pattern BP1 and the second bank patterns BP2 may be alternately arranged in the second direction DR2, in a form of island patterns, in the display area DPA. Light-emitting elements ED may be disposed between the first bank pattern BP1 and the second bank patterns BP2.

The electrodes RME may be disposed in the first subpixel SPX1, extending in a direction. The electrodes RME may extend in the first direction DR1 to be disposed in the emission area EMA of the first subpixel SPX1, and may be spaced apart from each other in the second direction DR2. The electrodes RME may be electrically connected to the light-emitting elements ED, but the disclosure is not limited thereto. As another example, the electrodes RME may not be electrically connected to the light-emitting elements ED. The electrodes RME may include a first electrode RME1 and second electrodes RME2.

Although not specifically illustrated, the first electrode RME1 may be electrically connected to a second conductive pattern CDP2, and the second electrodes RME2 may be electrically connected to a first conductive pattern CDP1.

The first electrode RME1 may be electrically connected to a 2-1th connecting conductive pattern DCL21 through a third contact hole CT3. The first electrode RME1 may contact (e.g., directly contact) the 2-1th connecting conductive pattern DCL21 through the third contact hole CT3. The 2-1th connecting conductive pattern DCL21 may be electrically connected to the second conductive pattern CDP2 or a second voltage line VL2.

The second electrodes RME2 may be electrically connected to a 1-1th connecting conductive pattern DCL11 through a second contact hole CT2. The second electrodes RME2 may contact (e.g., directly contact) the 1-1th connecting conductive pattern DCL11 through the second contact holes CT2. The 1-1th connecting conductive pattern DCL11 may be electrically connected to the first conductive pattern CDP1.

As FIGS. 5 to 8 illustrate, a first electrode RME1 and two second electrodes RME2 may be disposed in the first subpixel SPX1, but the disclosure is not limited thereto. For example, more than three electrodes RME may be disposed in the first subpixel SPX1, and a layout and a shape of the electrodes RME may vary.

The bank layer BNL may be disposed to surround the first subpixel SPX1, and may be disposed to surround the emission area EMA and the first and second subareas SA1 and SA2 of the first subpixel SPX1.

The light-emitting elements ED may be disposed in the emission area EMA of the first subpixel SPX1. The light-emitting elements ED may be disposed between the bank patterns BP1 and BP2, and may be spaced apart from one another in the first direction DR1. For example, the light-emitting elements ED may extend in a direction, and end portions of each of the light-emitting elements ED may be disposed on different electrodes RME. The length of the light-emitting elements ED may be greater than a distance, in the second direction DR2, of the electrodes RME. The light-emitting elements ED may be arranged in a direction perpendicular to the direction in which the electrodes RME extend, i.e., in a direction perpendicular to the first direction DR1, but the disclosure is not limited thereto. The direction in which the light-emitting elements ED extend may be the second direction DR2 or a direction inclined from the second direction DR2.

The light-emitting elements ED may include first light-emitting elements ED1, which are disposed on the first electrode RME1 and one of the second electrodes RME2, and second light-emitting elements ED2, which are disposed on the first electrode RME1 and on the other second electrode RME2.

The connecting electrodes CNE may be disposed on the electrodes RME and the bank patterns BP1 and BP2. The connecting electrodes CNE may extend in a direction, and may be spaced apart from one another. The connecting electrodes CNE may contact the light-emitting elements ED, and may be electrically connected to conductive layers therebelow.

The connecting electrodes CNE may include first, second, third, fourth, and fifth connecting electrodes CNE1, CNE2, CNE3, CNE4, and CNE5, which are disposed in the first subpixel SPX1.

The first connecting electrode CNE1 may be disposed on the first electrode RME1, extending in the first direction DR1. The first connecting electrode CNE1 may be disposed to overlap the first electrode RME1 in a plan view, and may extend in the first direction DR1 from the emission area EMA, and may thus be disposed even in the first subarea SA1 on the upper side of the emission area EMA. The first connecting electrode CNE1 may be electrically connected to a 2-2th connecting conductive pattern DCL22 through a fourth contact hole CT4. The first connecting electrode CNE1 may contact (e.g., directly contact) the 2-2th connecting conductive pattern DCL22 through the fourth contact hole CT4.

The second connecting electrode CNE2 may be spaced apart from the first connecting electrode CNE1 in the second direction DR2, and may be disposed on the second electrode RME2, extending in the first direction DR1. The second connecting electrode CNE2 may be electrically connected to a 1-2th connecting conductive pattern DCL12 through a first contact hole CT1. The second connecting electrode CNE2 may contact (e.g., directly contact) the 1-2th connecting conductive pattern DCL12 through the first contact hole CT1.

The third connecting electrode CNE3 may extend in the first direction DR1, overlapping the first and second electrodes RME1 and RME2 in a plan view. The third connecting electrode CNE3 may overlap the first electrode RME1 in a plan view, on a side, in the first direction DR1, of the first electrode RME1, and may extend in an opposite direction of the first direction DR1, be bent in the opposite direction of the second direction DR2, and extend back in the opposite direction of the first direction DR1 to overlap the second electrode RME2 in a plan view.

The fourth connecting electrode CNE4 may include first extensions, which extend in the first direction DR1 and are spaced apart from each other in the second direction DR2, and a second extension, which connects the first extensions and extends in the second direction DR2. A first extension of the fourth connecting electrode CNE4 disposed on another side, in the second direction DR2, may be disposed between the third and fifth connecting electrodes CNE3 and CNE5, and another first extension of the fourth connecting electrode CNE4 may be disposed on a side, in the second direction DR2, of the fifth connecting electrode CNE5.

The display device 10 may further include first, second, and third insulating layers PAS1, PAS2, and PAS3, which are disposed between the electrodes RME, the light-emitting elements ED, and the connecting electrodes CNE. The electrodes RME, the light-emitting elements ED, and the connecting electrodes CNE may be disposed to overlap one another in a plan view, but may contact, in part, one another because the presence of the first, second, and third insulating layers PAS1, PAS2, and PAS3.

The cross-sectional structure of the display device 10 will hereinafter be described with reference to FIGS. 5 to 8. The display device 10 may include a substrate SUB and a semiconductor layer, conductive layers, and insulating layers, which are disposed on the substrate SUB. The display device 10 may include, for example, in the first subpixel SPX1, electrodes RME, light-emitting elements ED, and connecting electrodes CNE. The semiconductor layer, the conductive layers, and the insulating layers may form a circuit layer of the display device 10.

The substrate SUB may be an insulating substrate. The substrate SUB may be formed of an insulating material such as glass, quartz, or a polymer resin. The substrate SUB may be a rigid substrate, or may be a flexible substrate that is bendable, foldable, or rollable. The substrate SUB may include a display area DPA and a non-display area NDA, which surrounds the display area DPA, and the display area DPA may include the emission area EMA and the first and second subareas SA1 and SA2, which are parts of the non-emission area.

The first conductive layer may be disposed on the substrate SUB. The first conductive layer may include a lower metal layer BML and first and second voltage lines VL1 and VL2. The lower metal layer BML may be disposed to overlap a first active layer ACT1 of a first transistor T1 in a plan view. The lower metal layer BML may prevent light from being incident upon the first active layer ACT1 of the first transistor T1, or may be electrically connected to the first active layer ACT1 to stabilize electrical characteristics of the first transistor T1. The lower metal layer BML may not be provided.

A high-potential voltage (or a first power supply voltage), which is to be delivered to the first electrode RME1, may be applied to the first voltage line VL1, and a low-potential voltage (or a second power supply voltage), which is to be delivered to the second electrode RME2, may be applied to the second voltage line VL2.

The first and second voltage lines VL1 and VL2 may be illustrated as being disposed in the first conductive layer, but the disclosure is not limited thereto.

A buffer layer BL may be disposed on the first conductive layer and the substrate SUB. The buffer layer BL may be formed on the substrate SUB to protect transistors of the pixels PX from moisture that may penetrate through the substrate SUB, which is vulnerable to moisture, and may perform a surface planarization function.

The semiconductor layer may be disposed on the buffer layer BL. The semiconductor layer may include the first active layer ACT1 of the first transistor T1 and a second active layer ACT2 of a second transistor T2. The first and second active layers ACT1 and ACT2 may be disposed to partially overlap first and second gate electrodes G1 and G2, respectively, of a second conductive layer that will be described below, in a plan view.

The semiconductor layer may include polycrystalline silicon, monocrystalline silicon, or an oxide semiconductor. As another example, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), or indium gallium zinc tin oxide (IGZTO).

FIGS. 5 to 8 illustrate that the first subpixel SPX1 may include one transistor, i.e., the first transistor T1, but the disclosure is not limited thereto. For example, the first subpixel SPX1 may include more than one transistor.

A gate insulating layer GI may be disposed on the semiconductor layer, in the display area DPA. The gate insulating layer GI may function as a gate insulating layer for first and second transistors T1 and T2. The gate insulating layer GI may be patterned together with first and second gate electrodes G1 and G2 of the second conductive layer that will be described below, and may thus be placed in part between the second conductive layer and the first and second active layers ACT1 and ACT2 of the semiconductor layer, but the disclosure is not limited thereto. As another example, the gate insulating layer GI may be disposed on an entire surface of the buffer layer BL.

The second conductive layer may be disposed on the gate insulating layer GI. The second conductive layer may include first gate electrodes G1 of the first transistors T1 and second gate electrodes G2 of the second transistors T2. The first gate electrode G1 may be disposed to overlap a channel region of the first active layer ACT1 in a thickness direction, i.e., in the third direction DR3 in a plan view, and the second gate electrode G2 may be disposed to overlap a channel region of the second active layer ACT2 in the thickness direction, i.e., in the third direction DR3 in a plan view. Although not specifically illustrated, the second conductive layer may further include a first electrode of a storage capacitor. The second conductive layer may further include the 1-1th and 2-1th connecting conductive patterns DCL11 and DCL21.

An interlayer insulating layer IL1 may be disposed on the second conductive layer. The interlayer insulating layer IL1 may function as an insulating film between the second conductive layer and layers disposed on the second conductive layer, and may protect the second conductive layer.

The third conductive layer may be disposed on the interlayer insulating layer IL1. The third conductive layer may include the first, second, and third conductive patterns CDP1, CDP2, and CDP3, a first source electrode S1 and a first drain electrode D1 of the first transistor T1, and a second source electrode S2 and a second drain electrode D2 of the second transistor T2. Some of the first, second, and third conductive patterns CDP1, CDP2, and CDP3 may electrically connect different conductive layers or different semiconductor layers, and may function as the source and drain electrodes of each of the first and second transistors T1 and T2.

The first conductive pattern CDP1 may contact the first active layer ACT1 of the first transistor T1 through a contact hole penetrating the interlayer insulating layer IL1. The first conductive pattern CDP1 may contact the lower metal layer BML, through a contact hole penetrating the interlayer insulating layer IL1 and the buffer layer BL. The first conductive pattern CDP1 may function as the first source electrode S1 of the first transistor T1. The first conductive pattern CDP1 may be electrically connected to the second electrode RME2 or the second connecting electrode CNE2. The first transistor T1 may transmit the first power supply voltage from the first voltage line VL1 to the second electrode RME2 or the second connecting electrode CNE2.

The second conductive pattern CDP2 may contact the second voltage line VL2 through a contact hole penetrating the interlayer insulating layer IL1 and the buffer layer BL. The second conductive pattern CDP2 may be electrically connected to the first electrode RME1 or the first connecting electrode CNE1. The second voltage line VL2 may transmit the second power supply voltage to the first electrode RME1 or the first connecting electrode CNE1.

The third conductive pattern CDP3 may contact the first voltage line VL1 through a contact hole penetrating the interlayer insulating layer IL1 and the buffer layer BL. The third conductive pattern CDP3 may contact the first active layer ACT1 of the first transistor T1 through a contact hole penetrating the interlayer insulating layer IL1. The third conductive pattern CDP1 may electrically connect the first transistor T1, and may function as the first drain electrode D1 of the first transistor T1.

The second source electrode S2 and the second drain electrode D2 may contact the second active layer ACT2 of the second transistor T2 through contact holes penetrating the interlayer insulating layer IL1. The second transistor T2 may transmit a data signal to the first transistor T1, or may transmit an initialization signal.

The third conductive layer may further include the 1-2th and 2-2th connecting conductive patterns DCL12 and DCL22.

The 1-1th and 1-2th connecting conductive patterns DCL11 and DCL12 may form first connecting conductive wiring DCL1, and the 2-1th and 2-2th connecting conductive patterns DCL21 and DCL22 may form second connecting conductive wiring DCL2. As illustrated in FIG. 5, the second connecting conductive wiring DCL2 may extend as a whole in the second direction DR2, in the first subpixel SPX1, and the first connecting conductive wiring DCL1 may be disconnected with the first electrode RME1 interposed therebetween. The first and second connecting conductive wirings DCL1 and DCL2 may include a same material. For example, the first and second connecting conductive wirings DCL1 and DCL2 may include copper (Cu). The 1-1th and 1-2th connecting conductive patterns DCL11 and DCL12 may be directly connected to each other. The 2-1th and 2-2th connecting conductive patterns DCL21 and DCL22 may be directly connected to each other.

The passivation layer PV1 may be disposed on the third conductive layer. The passivation layer PV1 may function as an insulating film between the third conductive layer and other layers, and may protect the third conductive layer.

Each of the buffer layer BL, the gate insulating layer GI, the interlayer insulating layer IL1, and the passivation layer PV1 may consist of inorganic layers that are alternately stacked. For example, each of the buffer layer BL, the gate insulating layer GI, the interlayer insulating layer IL1, and the passivation layer PV1 may be formed as a double- or multilayer in which inorganic layers of at least one of silicon oxide ($SiO_x$), silicon nitride ($SiN_x$), and silicon oxynitride ($SiO_xN_y$) are alternately stacked, but the disclosure is not limited thereto. In another example, each of the buffer layer BL, the gate insulating layer GI, the interlayer insulating layer IL1, and the passivation layer PV1 may be formed as a single inorganic layer including silicon oxide ($SiO_x$), silicon nitride ($SiN_x$), or silicon oxynitride ($SiO_xN_y$). In some embodiments, the interlayer insulating layer IL1 may be formed of an organic insulating material such as poly-imide (PI).

A via layer VIA may be disposed on the third conductive layer, in the display area DPA. The via layer VIA may include an organic insulating material such as, for example, polyimide (PI), and may perform a surface planarization function by compensating for any height differences generated by the underlying conductive layers. In some embodiments, the via layer VIA may not be provided.

The display device 10 may include, as a display element layer on the via layer VIA, the bank patterns BP1 and BP2, the electrodes RME, the bank layer BNL, the light-emitting elements ED, and the connecting electrodes CNE. The display device 10 may include the first, second, and third insulating layers PAS1, PAS2, and PAS3, which are disposed on the via layer VIA.

The bank patterns BP1 and BP2 may be disposed on the via layer VIA. For example, the bank patterns BP1 and BP2 may be disposed (e.g., disposed directly) on the via layer VIA, and may protrude at least in part from a top surface of the via layer VIA. Each of protruding parts of the bank patterns BP1 and BP2 may have inclined sides or curved or bent sides with a curvature, and light emitted from the light-emitting elements ED may be reflected by the electrodes RME on the bank patterns BP1 and BP2 to be emitted in an upward direction from the via layer VIA. As another example, the bank patterns BP1 and BP2 may have a curved or bent shape with a curvature, for example, a semicircular or semielliptical shape, in a cross-sectional view. The bank patterns BP1 and BP2 may include an inorganic insulating material such as polyimide (PI), but the disclosure is not limited thereto.

The electrodes RME may be disposed on the bank patterns BP1 and BP2 and the via layer VIA. The first electrode RME1 and the second electrodes RME2 may be disposed on at least inclined sides of the bank patterns BP1 and BP2. The second electrodes RME2 are illustrated as covering sides of the second bank patterns BP2 in the emission area EMA, but the disclosure is not limited thereto. For example, the second electrodes RME2 may also cover other sides of second bank patterns BP2 in emission areas EMA of other neighboring subpixels SPXn.

The light-emitting elements ED, which are disposed between the bank patterns BP1 and BP2, may emit light through end portions thereof, and the emitted light may travel toward the electrodes RME disposed on the bank patterns BP1 and BP2. Parts of the electrodes RME that are disposed on the bank patterns BP1 and BP2 may have a structure capable of reflecting the light emitted from the light-emitting elements ED. The first and second electrodes RME1 and RME2 may be disposed to cover at least sides of the bank patterns BP1 and BP2 to reflect light emitted from the light-emitting elements ED.

As already mentioned above, the first electrode RME1 may be directly connected to the 2-1th connecting conductive pattern DCL21 through the third contact hole CT3, which penetrates the via layer VIA, the passivation layer PV1, and the interlayer insulating layer IL1, and the second electrodes RME2 may be directly connected to the 1-1th connecting conductive pattern DCL11 through the second contact holes CT2, which penetrate the via layer VIA, the passivation layer PV1, and the interlayer insulating layer IL1.

The electrodes RME may include a conductive material with high reflectance. For example, the electrodes RME may include a metal such as silver (Ag), copper (Cu), or aluminum (Al), an alloy including aluminum (Al), nickel (Ni), or lanthanum (La), or a stack of a layer of such the alloy and a layer of a metal such as titanium (Ti), molybdenum (Mo), or niobium (Nb). For example, the electrodes RME may include aluminum (Al). In some embodiments, the electrodes RME may be formed as a double- or multilayer in which at least one layer of an alloy containing aluminum (Al) and at least one layer of a metal such as titanium (Ti), molybdenum (Mo), or niobium (Nb) are stacked.

However, the disclosure is not limited to this. As another example, the electrodes RME may further include a transparent conductive material. For example, the electrodes RME may include a material such as ITO, IZO, or IZTO. In some embodiments, the electrodes RME may have a structure in which at least one layer of the transparent conductive material and at least one layer of a metal with high reflectance are stacked, or may be formed as single-layer films including the transparent conductive material and the metal with high reflectance. For example, the electrodes RME may have a stack structure such as ITO/Ag/ITO/, ITO/Ag/IZO, or ITO/Ag/IZTO/IZO. The electrodes RME may be electrically connected to the light-emitting elements ED, and may reflect light some of light, emitted from the light-emitting elements ED, in an upward direction from the substrate SUB.

The first insulating layer PAS1 may be disposed on the via layer VIA and the electrodes RME. The first insulating layer PAS1 may include an insulating material, and may thus protect the electrodes RME and insulate the electrodes RME from each other. As the first insulating layer PAS1 is disposed to cover the electrodes RME, before a formation of the bank layer BNL, the first insulating layer PAS1 can prevent the electrodes RME from being damaged during the formation of the bank layer BNL. Also, the first insulating layer PAS1 can prevent the light-emitting elements ED from contacting (e.g., directly contacting), and damaged by, other members.

The first insulating layer PAS1 may be formed to be recessed in part between the electrodes RME, which are spaced apart from each other in the second direction DR2. The light-emitting elements ED may be disposed on a top surface of a recessed part of the first insulating layer PAS1, and space may be formed between the light-emitting elements ED and the first insulating layer PAS1.

The bank layer BNL may be disposed on the first insulating layer PAS1. The bank layer BNL may include parts extending in the first direction DR1 and parts extending in the second direction DR2, and may surround the first subpixel SPX1. The bank layer BNL may surround the emission area EMA and the first and second subareas SA1 and SA2 of the first subpixel SPX1 to define and separate the emission area EMA and the first and second subareas SA1 and SA2. The bank layer BNL may also be disposed along the boundaries of the display area DPA to define and separate the display area DPA and the non-display area NDA. The parts of the bank layer BNL extending in the first direction DR1 may separate the emission area EMA and the first and second subareas SA1 and SA2, and the parts of the bank layer BNL extending in the second direction DR2 may separate the first subpixel SPX1 from other subpixels SPXn. The parts of the bank layer BNL extending in the second direction DR2 may be disposed on the second bank patterns BP2.

The bank layer BNL, like the bank patterns BP1 and BP2, may have a height. In some embodiments, the height of the bank layer BNL may be greater than a height of the bank patterns BP1 and BP2, and a thickness of the bank layer BNL may be a same as, or greater than, a thickness of the bank patterns BP1 and BP2. The bank layer BNL may prevent ink from spilling between neighboring subpixels SPXn in an inkjet printing process during a fabrication of the display device 10. The bank layer BNL, like the bank patterns BP1 and BP2, may include an organic insulating material such as polyimide (PI).

The light-emitting elements ED may be disposed in the emission area EMA of the first subpixel SPX1. The light-emitting elements ED may be disposed on the first insulating layer PAS1, between the bank patterns BP1 and BP2. The light-emitting elements ED may be arranged such that a direction in which the light-emitting elements ED extend are parallel to a top surface of the substrate SUB. As will be described below, each of the light-emitting elements ED may include multiple semiconductor layers that are arranged in the direction in which the light-emitting elements ED extend, and the multiple semiconductor layers may be sequentially arranged in a direction parallel to the top surface of the substrate SUB. However, the disclosure is not limited to this. As another example, the multiple semiconductor layers may be arranged in a direction perpendicular to the substrate SUB.

The light-emitting elements ED of each subpixel SPXn may emit light of a different wavelength range depending on materials of the semiconductor layers of each of the light-emitting elements ED of each subpixel SPXn, but the disclosure is not limited thereto. As another example, the semiconductor layers of each of the light-emitting elements ED of one subpixel SPXn may include same materials as the semiconductor layers of each of the light-emitting elements ED of another subpixel SPXn, so that the light-emitting elements ED of one subpixel SPXn may emit light of same color as the light-emitting elements ED of another subpixel SPXn.

The light-emitting elements ED may contact the connecting electrodes CNE to be electrically connected to the light-emitting elements RME and the conductive layers below the via layer VIA, and may emit light of a particular wavelength range in response to electrical signals being applied thereto.

The second insulating layer PAS2 may be disposed on the light-emitting elements ED, the first insulating layer PAS1, and the bank layer BNL. The second insulating layer PAS2 may include pattern parts, which extend in the first direction DR1 between the bank patterns BP1 and BP2 and are disposed on the light-emitting elements ED. The pattern parts may be disposed to surround outer surfaces of each of the light-emitting elements ED, but not to cover sides or end portions of each of the light-emitting elements ED. The pattern parts may form linear or island patterns in the first subpixel SPX1 in a plan view. The pattern parts of the second insulating layer PAS2 may protect the light-emitting elements ED, and may fix the light-emitting elements ED during the fabrication of the display device 10. The second insulating layer PAS2 may be disposed to fill a space between the first insulating layer PAS1 and the light-emitting elements ED. Parts of the second insulating layer PAS2 may be disposed on the bank layer BNL and in the first and second subareas SA1 and SA2.

The connecting electrodes CNE may be disposed on the electrodes RME and the bank patterns BP1 and BP2.

The first, second, and third connecting electrodes CNE1, CNE2, and CNE3 may be disposed on the second insulating layer PAS2, and may contact the light-emitting elements ED. The first connecting electrode CNE1 may contact first end portions of the first light-emitting elements ED1. The second connecting electrode CNE2 may contact second end portions of the second light-emitting elements ED2. The third connecting electrode CNE3 may contact the first end portions and second end portions of the second light-emitting elements ED2. The fourth connecting electrode CNE4 may contact the second end portions of the first light-emitting elements ED1 and the first end portions of the second light-emitting elements ED2. The fifth connecting electrode CNE5 may contact the first end portions and the second end portions of the first light-emitting elements ED1. The first connecting electrodes CNE1 may be directly connected to the 2-2th connecting conductive patterns DCL22 through the fourth contact hole CT4, which penetrate the first insulating layer PAS1, the second insulating layer PAS2, the via layer VIA, and the passivation layer PV1. The second connecting electrodes CNE2 may be directly connected to the 1-2th connecting conductive patterns DCL12 through the first contact hole CT1, which penetrate the first insulating layer PAS1, the second insulating layer PAS2, the via layer VIA, and the passivation layer PV1.

The connecting electrodes CNE may include a conductive material. For example, the connecting electrodes CNE may include ITO, IZO, IZTO, or aluminum (Al). For example, the connecting electrodes CNE may include a transparent conductive material so that light emitted by the light-emitting elements ED may be output through the connecting electrodes CNE.

The third insulating layer PAS3 may be disposed on the third connecting electrode CNE3 and the second insulating layer PAS2 which are of a first connecting electrode layer. The third insulating layer PAS3 may be disposed on an entire surface of the second insulating layer PAS2 to cover the third connecting electrode CNE3, and the first and second connecting electrodes CNE1 and CNE2 which are of a second connecting electrode layer may be disposed on the third insulating layer PAS3. The third insulating layer PAS3 may insulate the first and second connecting electrodes CNE1 and CNE2 from each other so that the first and second connecting electrodes CNE1 and CNE2 do not contact (e.g., directly contact) the third connecting electrode CNE3.

The display device 10 may have a structure in which the first electrode RME1 and the first connecting electrodes CNE1 are not directly connected to each other, but are directly connected to the second connecting conductive wirings DCL2. The display device 10 may also have a structure in which the second electrode RME2 and the second connecting electrodes CNE2 are not directly connected to each other, but are directly connected to the first connecting conductive wirings DCL1. The first and second connecting conductive wirings DCL1 and DCL2 may be formed of copper (Cu). In a case where the first electrode RME1 and the second electrodes RME2 are directly connected to the first connecting electrodes CNE1 and the second connecting electrodes CNE2, respectively, a resistance of the display device 10 may generally increase. For example, in a case where the first electrode RME1 and the second electrodes RME2 are formed of aluminum (Al), a film of aluminum oxide may be formed on the first electrode RME1 and the second electrodes RME2, and as a result, a connecting resistance between the first electrode RME1 and the first connecting electrode CNE1 and a connecting resistance between the second electrodes RME2 and the second connecting electrode CNE2 may increase. However, as the first electrode RME1 is directly connected to the 2-1th connecting conductive patterns DCL21 through the third contact hole CT3 and the first connecting electrodes CNE1 is directly connected to the 2-2th connecting conductive patterns DCL22 through the fourth contact hole CT4, increases in the connecting resistances between the first electrode RME1 and the first connecting electrode CNE1 can be prevented in advance. As the second electrodes RME2 is directly connected to the 1-1th connecting conductive patterns DCL11 through the second contact holes CT2 and the second connecting electrodes CNE2 is directly connected to 1-2th connecting conductive patterns DCL12 through the first contact hole CT1, increases in the connecting resistances between the second electrodes RME2 and the second connecting electrode CNE2 can be also prevented in advance.

The first, second, and third insulating layers PAS1, PAS2, and PAS3 may include an inorganic insulating material or an organic insulating material. For example, the first, second, and third insulating layers PAS1, PAS2, and PAS3 may all include an inorganic insulating material. In another example, the first and third insulating layers PAS1 and PAS3 may include an inorganic insulating material, and the second insulating layer PAS2 may include an organic insulating material. At least one of the first, second, and third insulating layers PAS1, PAS2, and PAS3 may have a structure in which multiple insulating layers are alternately or repeatedly stacked. The first, second, and third insulating layers PAS1, PAS2, and PAS3 may include one of silicon oxide ($SiO_x$), silicon nitride ($SiN_x$), and silicon oxynitride ($SiO_xN_y$). The first, second, and third insulating layers PAS1, PAS2, and PAS3 may include a same material, some of the first, second, and third insulating layers PAS1, PAS2, and PAS3 may include a same material, or the first, second, and third insulating layers PAS1, PAS2, and PAS3 may include different materials.

Figure 9:
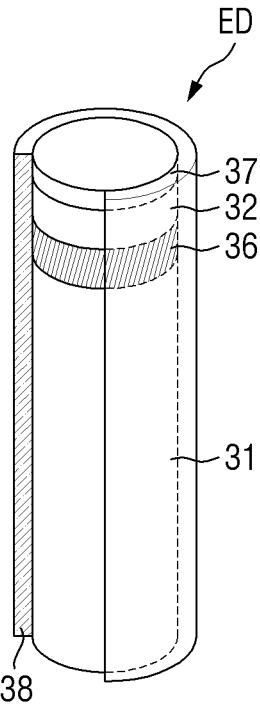
FIG. 9 is a schematic perspective view of a light-emitting element according to an embodiment of the disclosure.

FIG. 9 is a schematic perspective view of a light-emitting element according to an embodiment of the disclosure.

Referring to FIG. 9, a light-emitting element ED may be an LED. For example, the light-emitting element ED may be an ILED having a size of several nanometers or micrometers and formed of an inorganic material. If an electric field is formed in a particular direction between two opposite electrodes, the light-emitting element ED may be aligned between the two electrodes where polarities are formed.

The light-emitting element ED may have a shape that extends in a direction. The light-emitting element ED may have the shape of a cylinder, a rod, a wire, or a tube, but the shape of the light-emitting element ED is not particularly limited. As another example, the light-emitting element ED may have the shape of a polygonal column such as a regular cube, a rectangular parallelepiped, or a hexagonal column, or may have a shape that extends in a direction but with a partially inclined outer surface.

The light-emitting element ED may include semiconductor layers doped with a dopant of an arbitrary conductivity type (e.g., a p type or an n type). The semiconductor layers may receive electric signals from an external power source to emit light of a particular wavelength range. The light-emitting element ED may include a first semiconductor layer 31, a second semiconductor layer 32, a light-emitting layer 36, an electrode layer 37, and an insulating film 38.

The first semiconductor layer 31 may include an n-type semiconductor. The first semiconductor layer 31 may include a semiconductor material, i.e., $Al_xGa_yIn_{1-x-y}N$ (where $0\leq x\leq1$, $0\leq y\leq1$, and $0\leq x+y\leq1$). For example, the first semiconductor layer 31 may include at least one of AlGaInN, GaN, AlGaN, InGaN, AlN, and InN that are doped with an n-type dopant. The n-type dopant may be Si, Ge, Sn, or Se.

The second semiconductor layer 32 may be disposed on the first semiconductor layer 31 with the light-emitting layer 36 interposed therebetween. The second semiconductor layer 32 may include a p-type semiconductor. The second semiconductor layer 32 may include a semiconductor material, i.e., $Al_xGa_yIn_{1-x-y}N$ (where $0\leq x\leq1$, $0\leq y\leq1$, and $0\leq x+y\leq1$). For example, the second semiconductor layer 32 may include at least one of AlGaInN, GaN, AlGaN, InGaN, AlN, and InN that are doped with a p-type dopant. The p-type dopant may be Mg, Zn, Ca, or Ba.

FIG. 9 illustrates that the first and second semiconductor layers 31 and 32 are formed as single layers, but the disclosure is not limited thereto. As another example, each of the first and second semiconductor layers 31 and 32 may include more than a double layer such as, for example, a clad layer or a tensile strain barrier reducing (TSBR) layer, depending on the material of the light-emitting layer 36. For example, the light-emitting element ED may further include a semiconductor layer between the first semiconductor layer 31 and the light-emitting layer 36 or a semiconductor layer between the second semiconductor layer 32 and the light-emitting layer 36. The semiconductor layer between the first semiconductor layer 31 and the light-emitting layer 36 may include at least one of AlGaInN, GaN, AlGaN, InGaN, AlN, InN, and SLs that are doped with an n-type dopant, and the semiconductor layer between the second semiconductor layer 32 and the light-emitting layer 36 may include at least one of AlGaInN, GaN, AlGaN, InGaN, AlN, and InN that are doped with a p-type dopant.

The light-emitting layer 36 may be disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electric signals applied thereto via the first and second semiconductor layers 31 and 32. The light-emitting layer 36 may include a material such as AlGaN, AlGaInN, or InGaN, in a case where the light-emitting layer 36 has a multi-quantum well structure in which multiple quantum layers and multiple well layers are alternately stacked, the quantum layers may include a material such as AlGaN or AlGaInN, and the well layers may include a material such as GaN, InGaN, or AlInN.

The light-emitting layer 36 may have a structure in which a semiconductor material having a large band gap energy and a semiconductor material having a small band gap energy are alternately stacked, or may include group-III or group-V semiconductor materials depending on a wavelength of light to be emitted. The type of light emitted by the light-emitting layer 36 is not particularly limited. The light-emitting layer 36 may emit light of a red or green wavelength range as necessary, instead of light of a blue wavelength.

The electrode layer 37 may be an ohmic connecting electrode, but the disclosure is not limited thereto. As another example, the electrode layer 37 may be a Schottky connecting electrode. The light-emitting element ED may include at least one electrode layer 37. The light-emitting element ED may include more than one electrode layer 37, but the disclosure is not limited thereto. As another example, the electrode layer 37 may not be provided.

The electrode layer 37 may reduce a resistance between the light-emitting element ED and electrodes RME or (connecting electrodes CNE) in case that the light-emitting element ED is electrically connected to the electrodes RME or (the connecting electrodes CNE). The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium zinc titanium oxide (IZTO).

The insulating film 38 may be disposed to surround the first and second semiconductor layers 31 and 32 and the electrode layer 37. For example, the insulating film 38 may be disposed to surround at least the light-emitting layer 36, but to expose end portions, in a length direction, of the light-emitting element ED. The insulating film 38 may be formed to be rounded in a schematic cross-sectional view, in a region adjacent to at least one end of the light-emitting element ED.

The insulating film 38 may include a material with insulating properties such as, for example, silicon oxide $(SiO_x)$, silicon nitride $(SiN_x)$, silicon oxynitride $(SiO_xN_y)$, aluminum nitride $(AlN_x)$, aluminum oxide $(AlO_x)$, zirconium oxide $(ZrO_x)$, hafnium oxide $(HfO_x)$, or titanium oxide $(TiO_x)$. The insulating film 38 is illustrated as being a single-layer film, but the disclosure is not limited thereto. As another example, in some embodiments, the insulating film 38 may be formed as a multilayer film in which multiple layers are stacked.

The insulating film 38 may protect the first and second semiconductor layers 31 and 32 and the electrode layer 37. The insulating film 38 can prevent a short circuit that may occur in the light-emitting element 36 in case that the light-emitting element ED contacts (e.g., directly contacts) electrodes to which electric signals are applied. Also, the insulating film 38 can prevent a degradation of an emission efficiency of the light-emitting element ED.

An outer surface of the insulating film 38 may be subjected to surface treatment. The light-emitting element ED may be sprayed on electrodes while being dispersed in ink. Here, the outer surface of the insulating film 38 may be hydrophobically or hydrophilically treated to keep the light-emitting element ED dispersed in the ink without agglomerating with other neighboring light-emitting elements ED.

A method of manufacturing the display device 10 will hereinafter be described with reference to FIGS. 10 to 23 and further to FIGS. 1 to 8.

FIGS. 10 to 23 are schematic cross-sectional views illustrating a method of fabricating a display device according to an embodiment of the disclosure.

Figure 10:
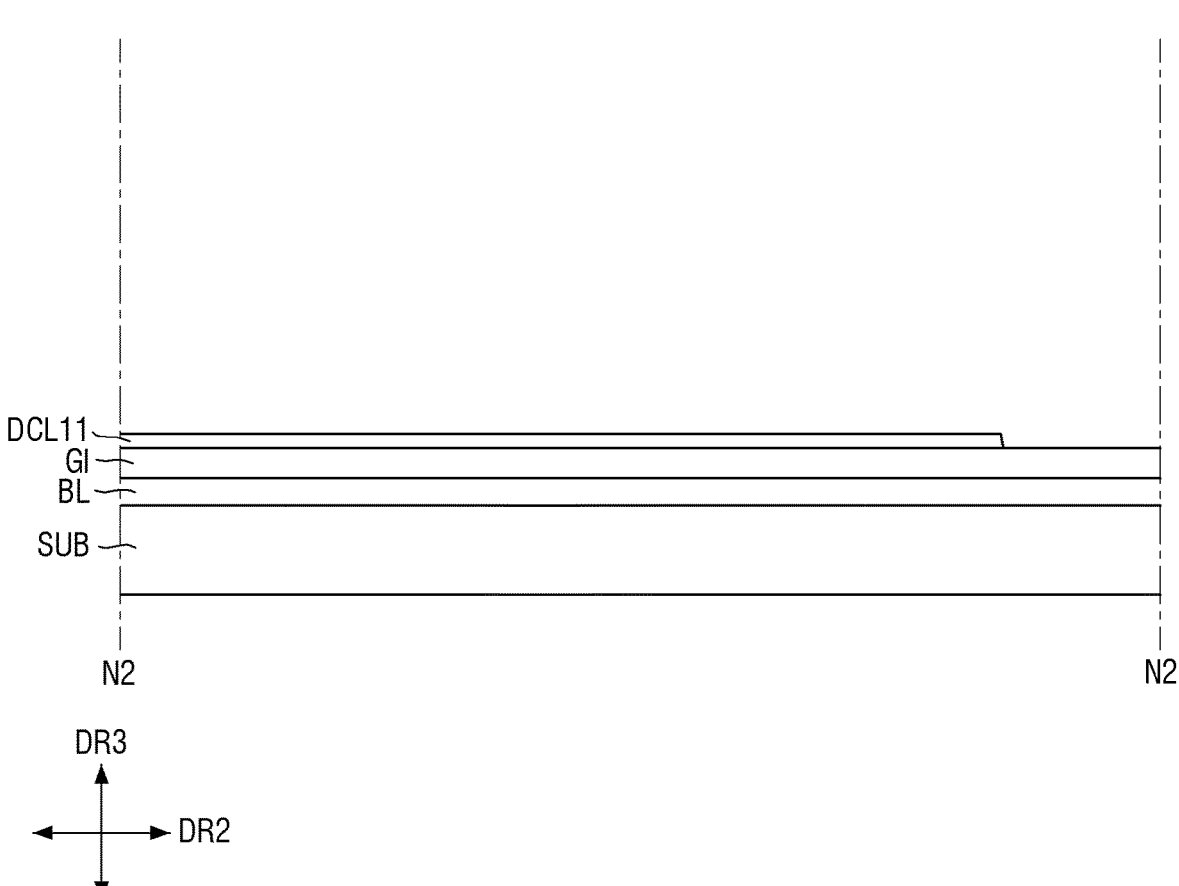
FIGS. 10 to 23 are schematic cross-sectional views illustrating a method of fabricating a display device according to an embodiment of the disclosure.
Figure 11:
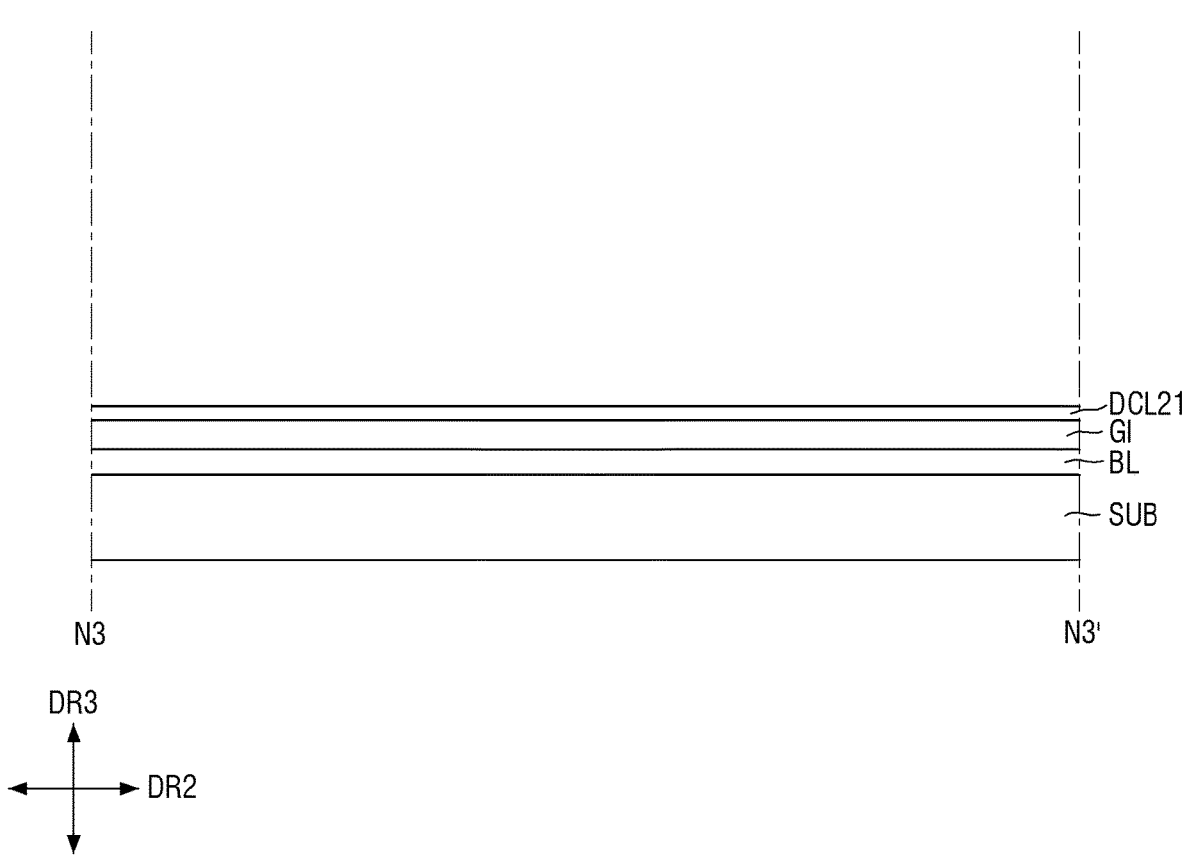

Referring to FIGS. 10 and 11, a buffer layer BL may be formed on a substrate SUB, a gate insulating layer GI may be formed on the buffer layer BL, a second conductive layer may be formed on the gate insulating layer GI. The second conductive layer may include first gate electrodes G1 of first transistors T1, second gate electrodes G2 of second transistor T2, 1-1th connecting conductive patterns DCL11, and 2-1th connecting conductive patterns DCL21.

Figure 12:
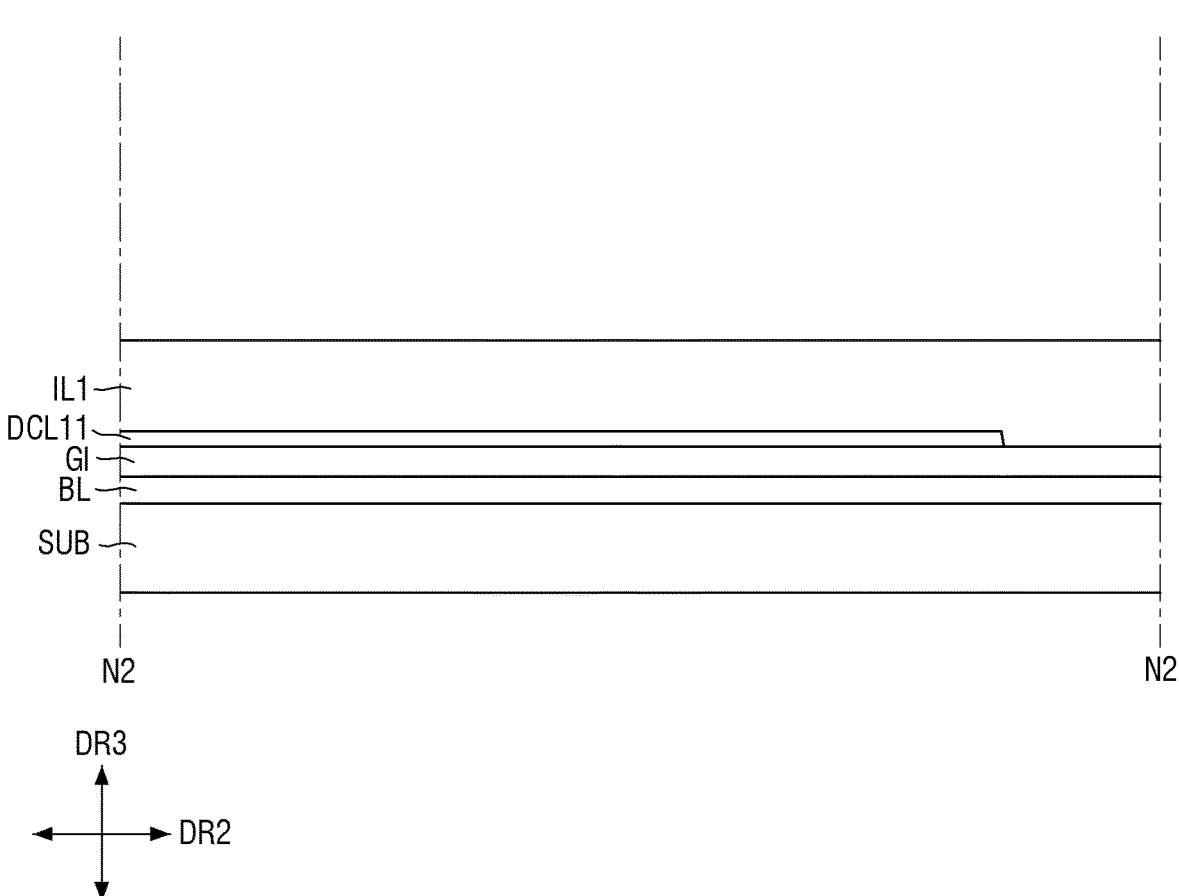
Figure 13:
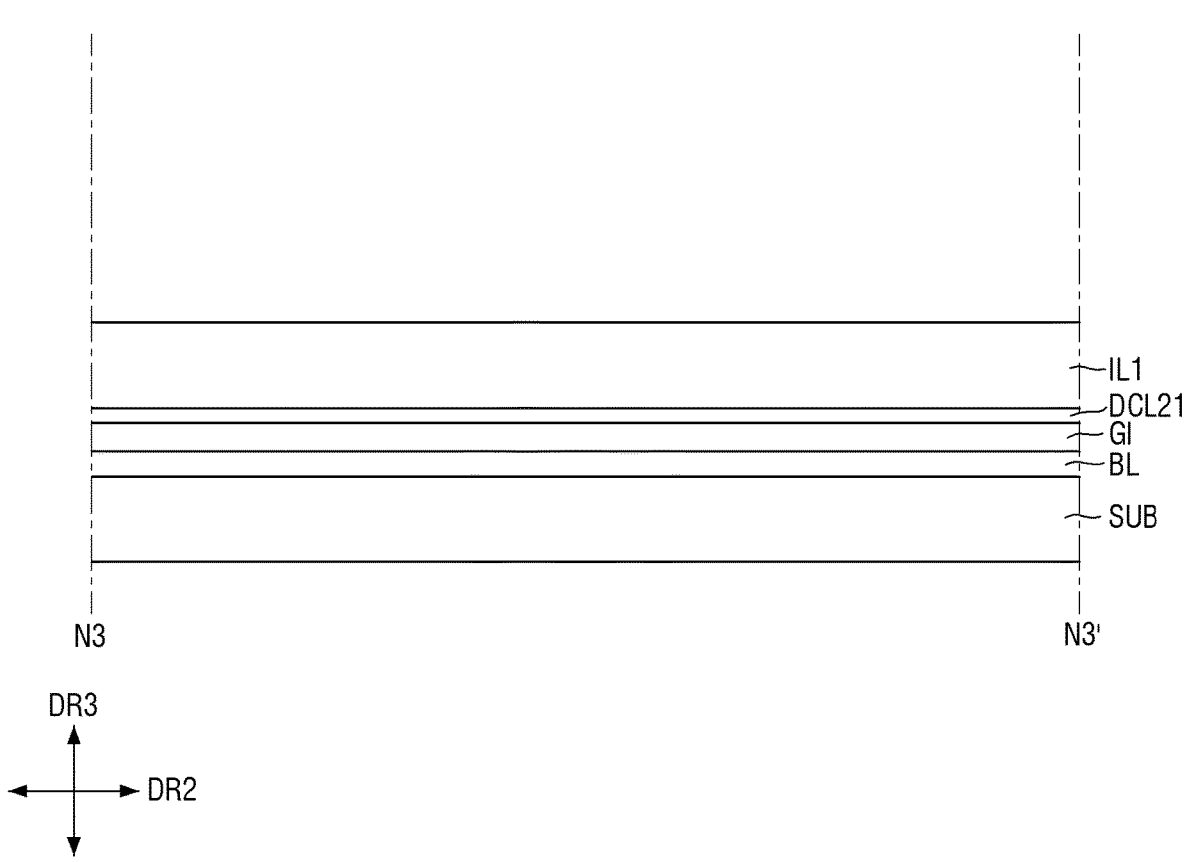

Thereafter, referring to FIGS. 12 and 13, an interlayer insulating layer IL1 may be formed on the second conductive layer.

Figure 14:
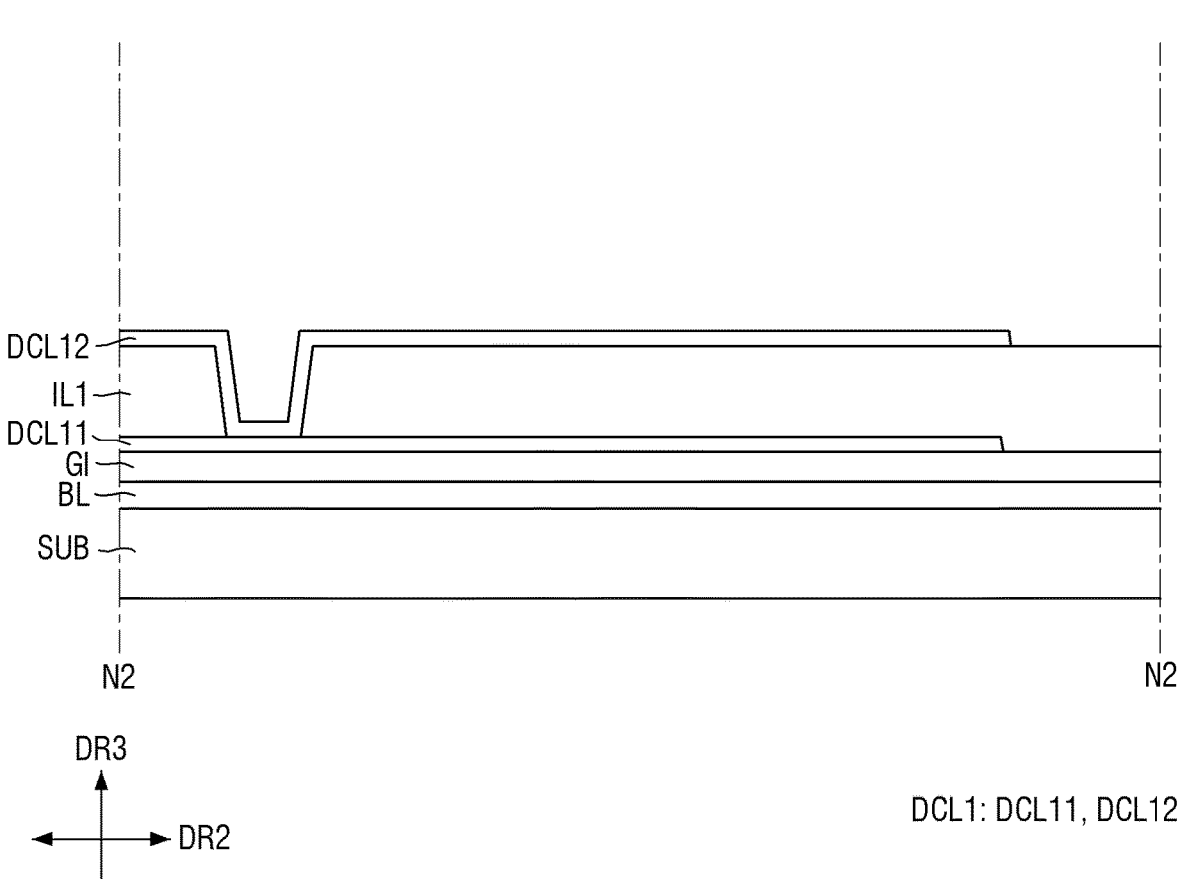
Figure 15:
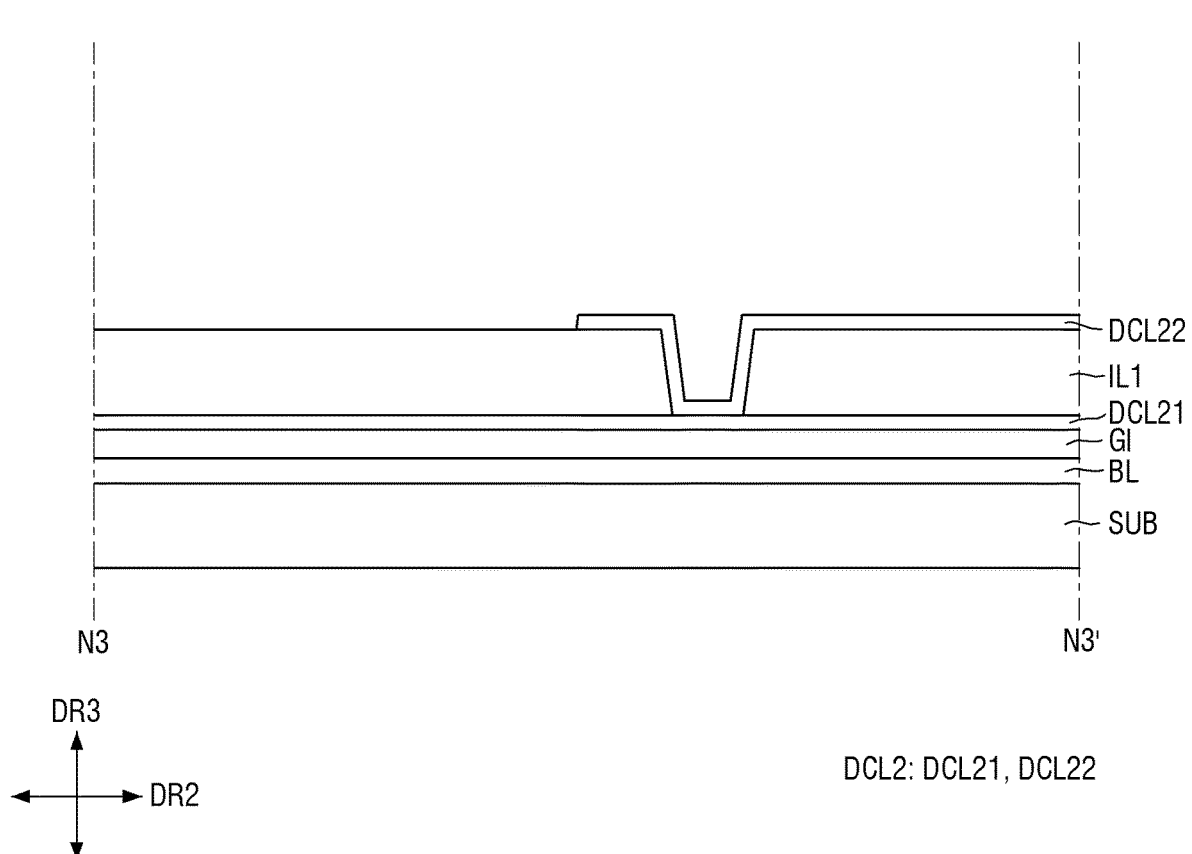

Thereafter, referring to FIGS. 14 and 15, a third conductive layer may be formed on the interlayer insulating layer IL1. The third conductive layer may include first source electrodes S1 of the first transistors T1, second source electrodes S2 of the second transistors T2, first drain electrodes D1 of the first transistors T1, second drain electrodes D2 of the second transistors T2, and 1-2th and 2-2th connecting conductive patterns DCL12 and DCL22.

Figure 16:
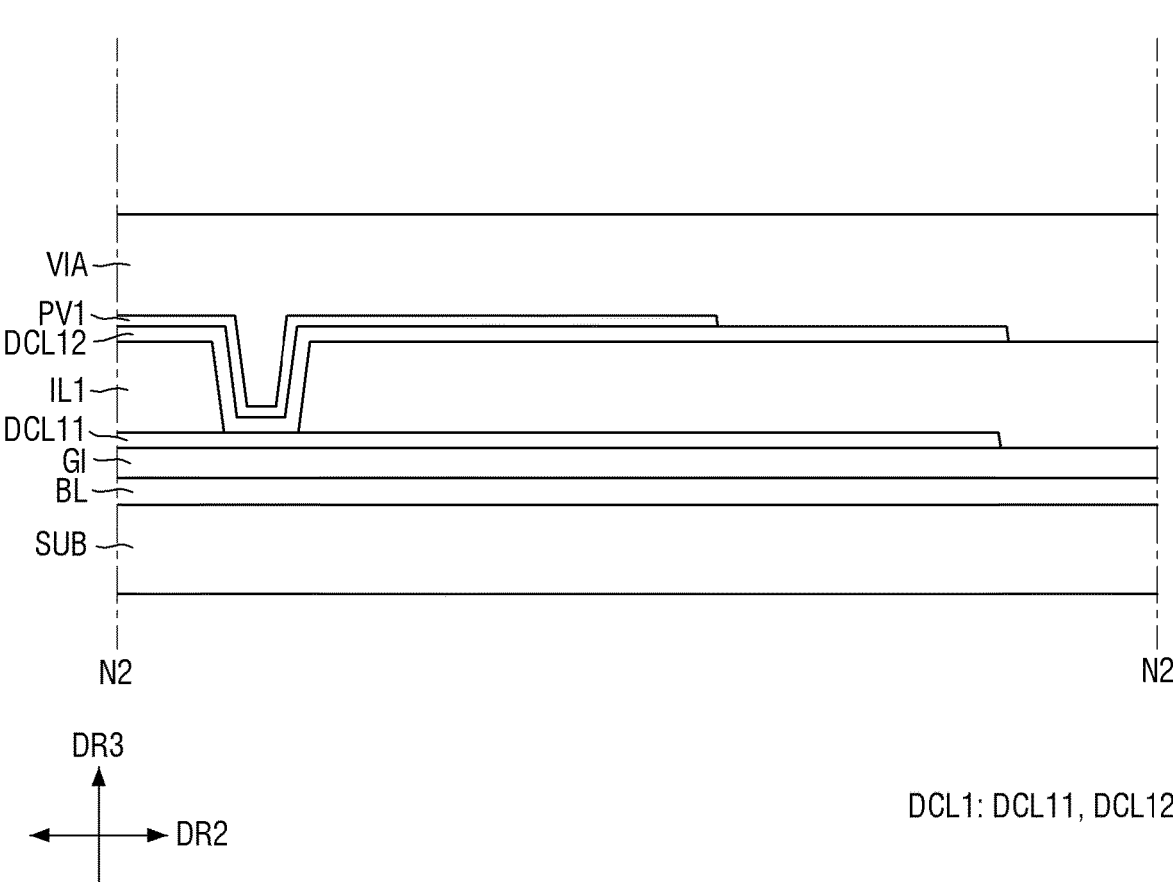
Figure 17:
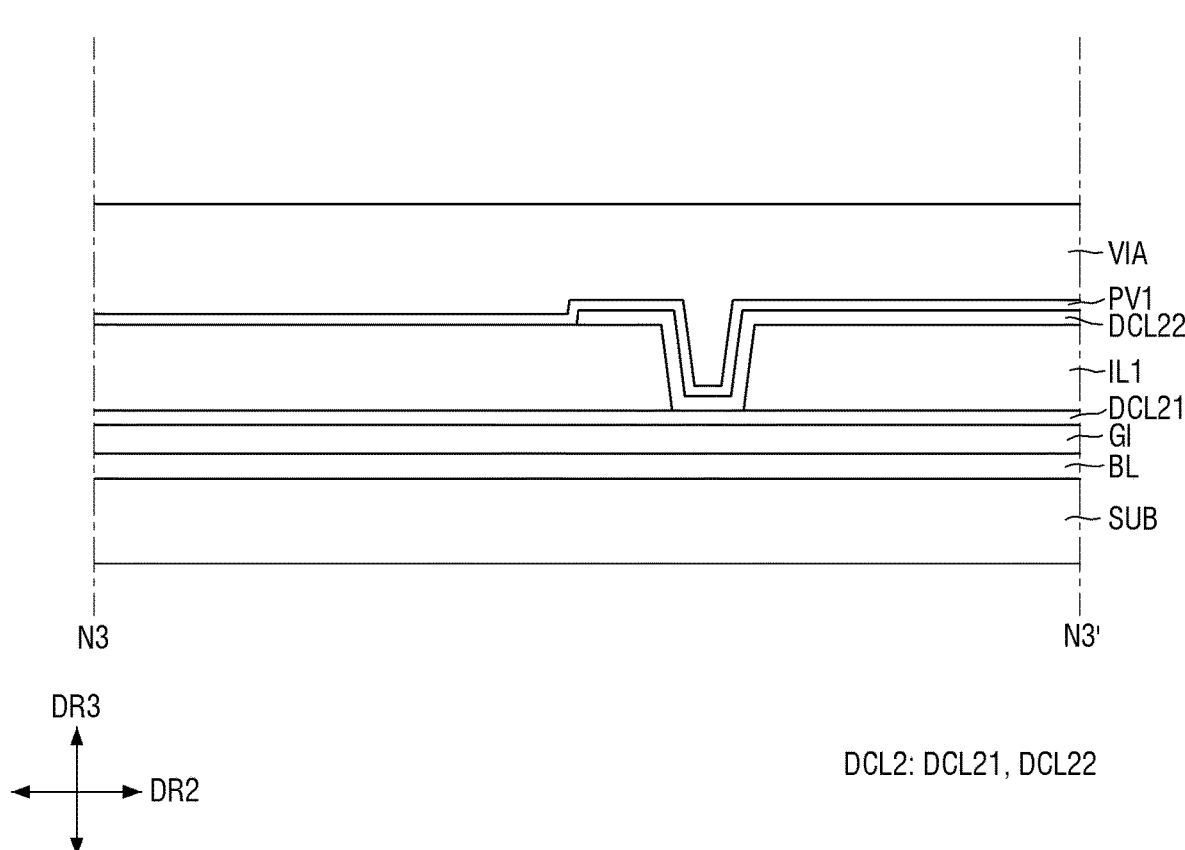

Thereafter, referring to FIGS. 16 and 17, a passivation layer PV1 may be formed on the third conductive layer, and a via layer VIA may be formed on the passivation layer PV1.

Figure 18:
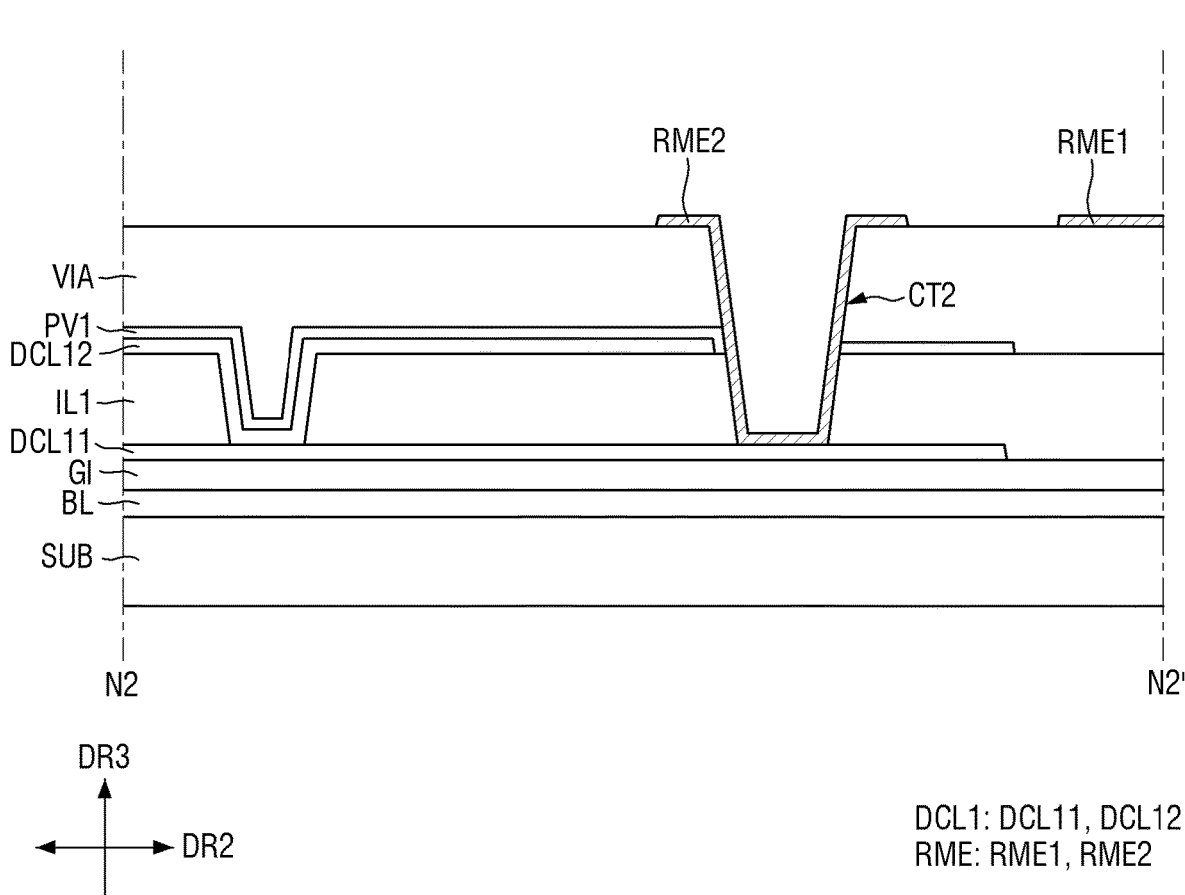
Figure 19:
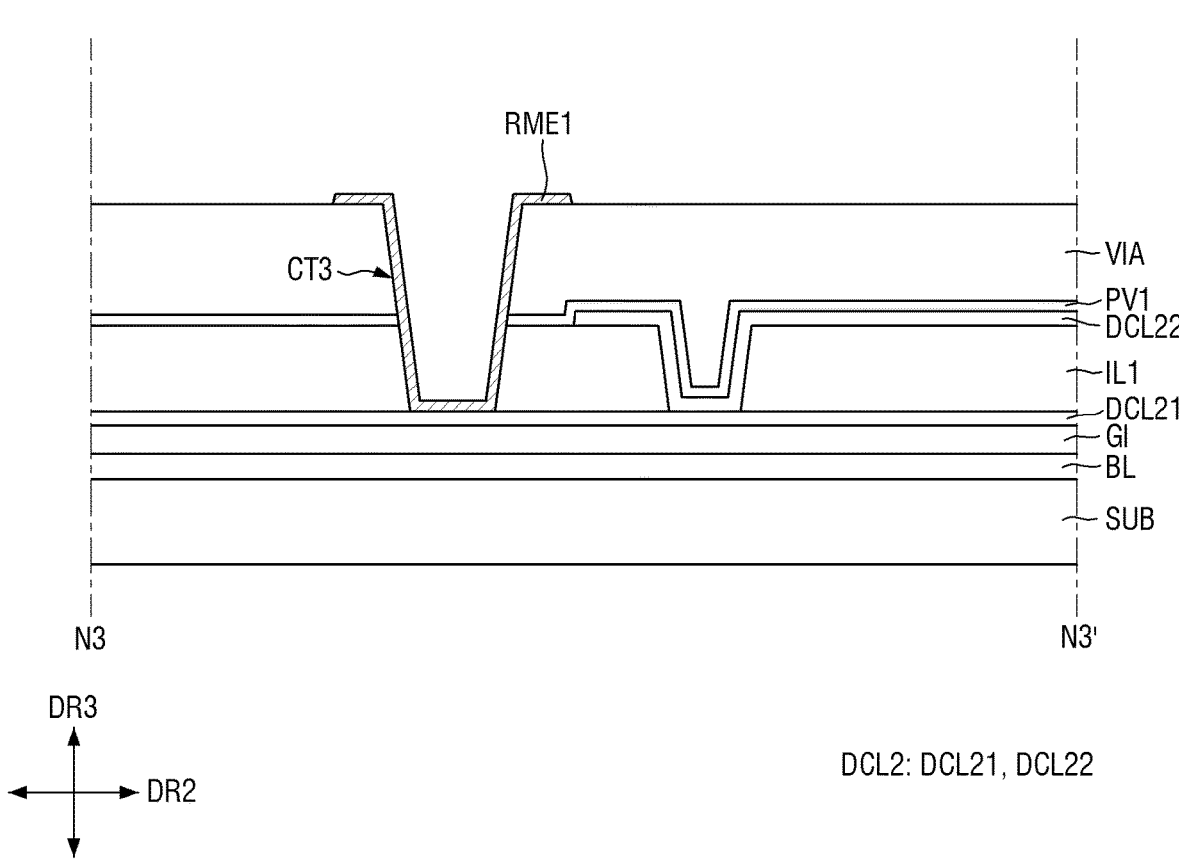
Figure 20:
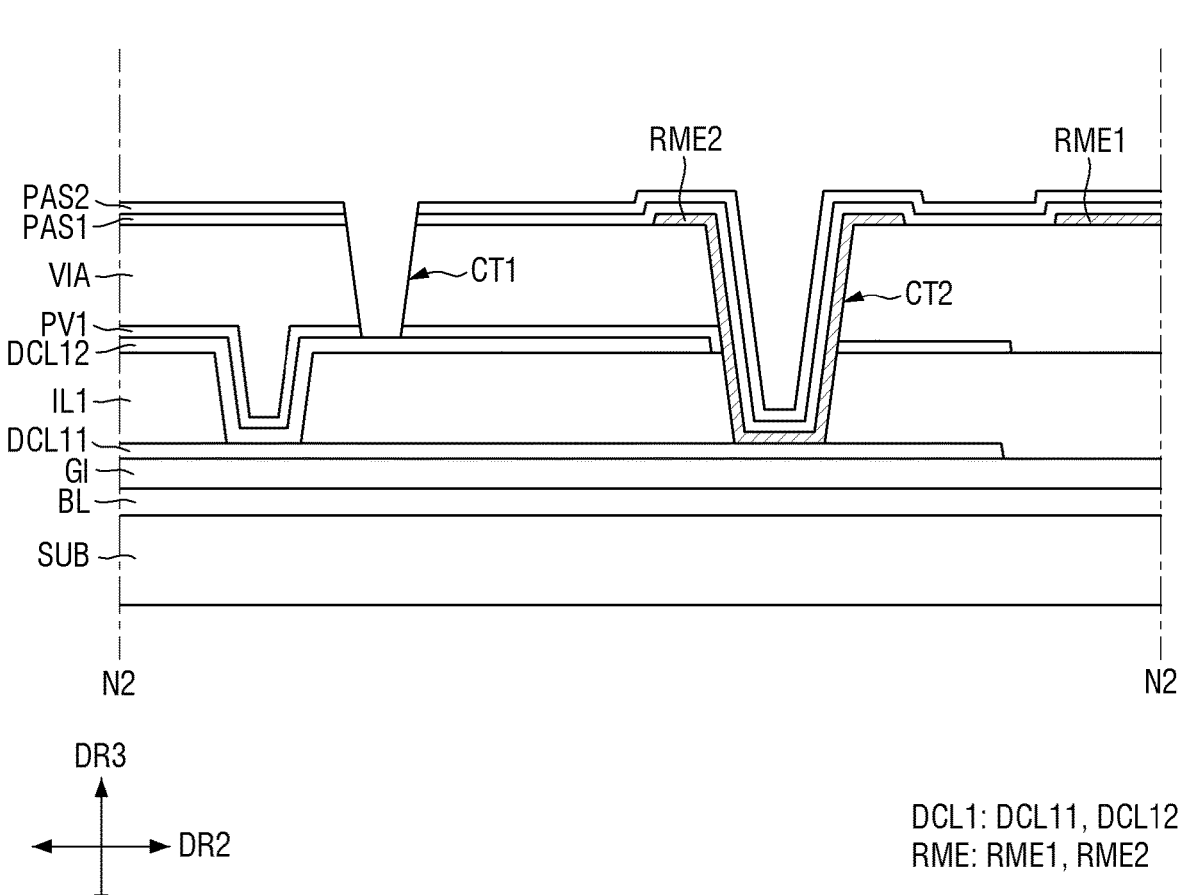
Figure 21:
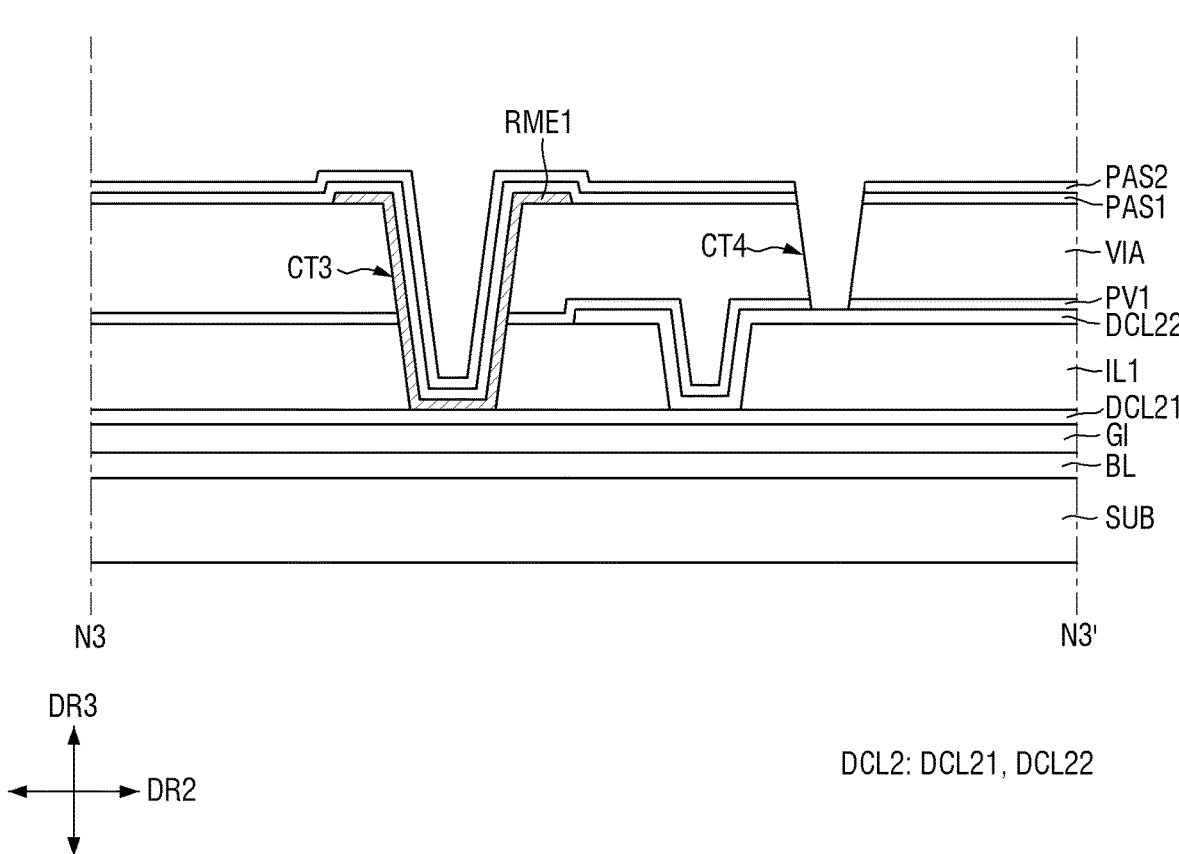
Figure 22:
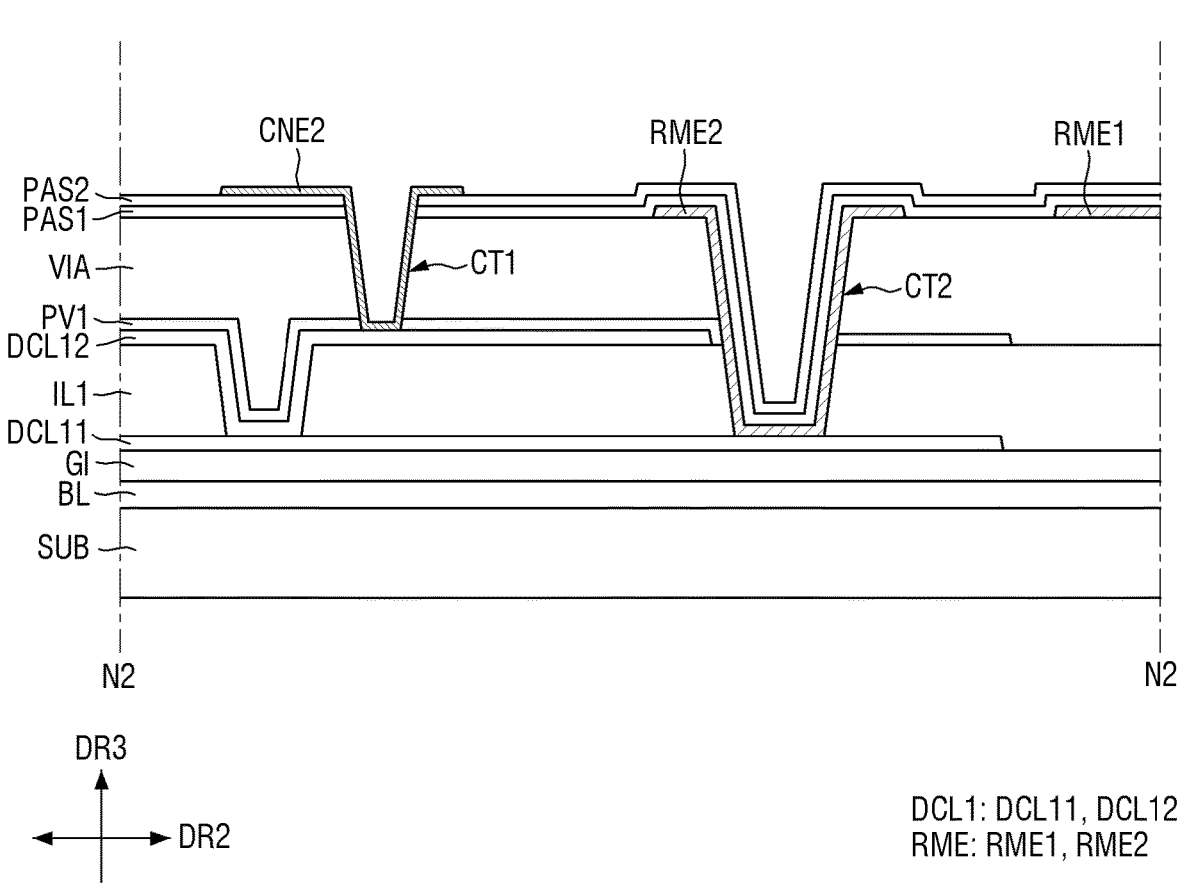
Figure 23:
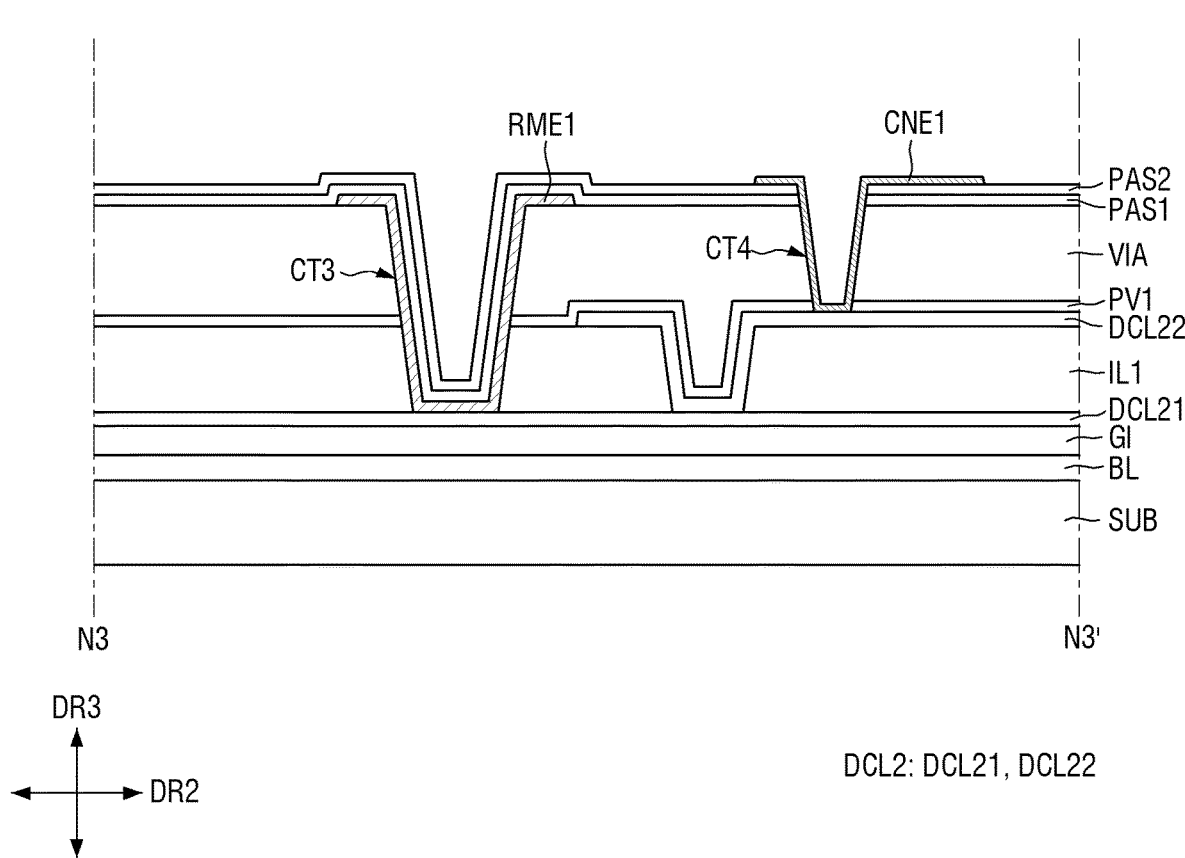

Thereafter, referring to FIGS. 18 and 19, electrodes RME may be formed on the via layer VIA. A first electrode RME1 may be directly connected to the 2-1th connecting conductive pattern DCL21 through a third contact hole CT3, and a second electrode RME2 may be directly connected to the 1-1th connecting conductive pattern DCL11 through a second contact hole CT2.

Thereafter, referring to FIGS. 20 to 23, a first insulating layer PAS1 may be formed on the electrodes RME, a second insulating layer PAS2 may be formed on the first insulating layer PAS1, and connecting electrodes CNE may be formed on the second insulating layer PAS2. A first connecting electrode CNE1 may be directly connected to the 2-2th connecting conductive pattern DCL22 through a fourth contact hole CT4, and a second connecting electrode CNE2 may be directly connected to the 1-2th connecting conductive pattern DCL12 through a first contact hole CT1.

Display devices according to other embodiments of the disclosure will hereinafter be described.

Figure 24:
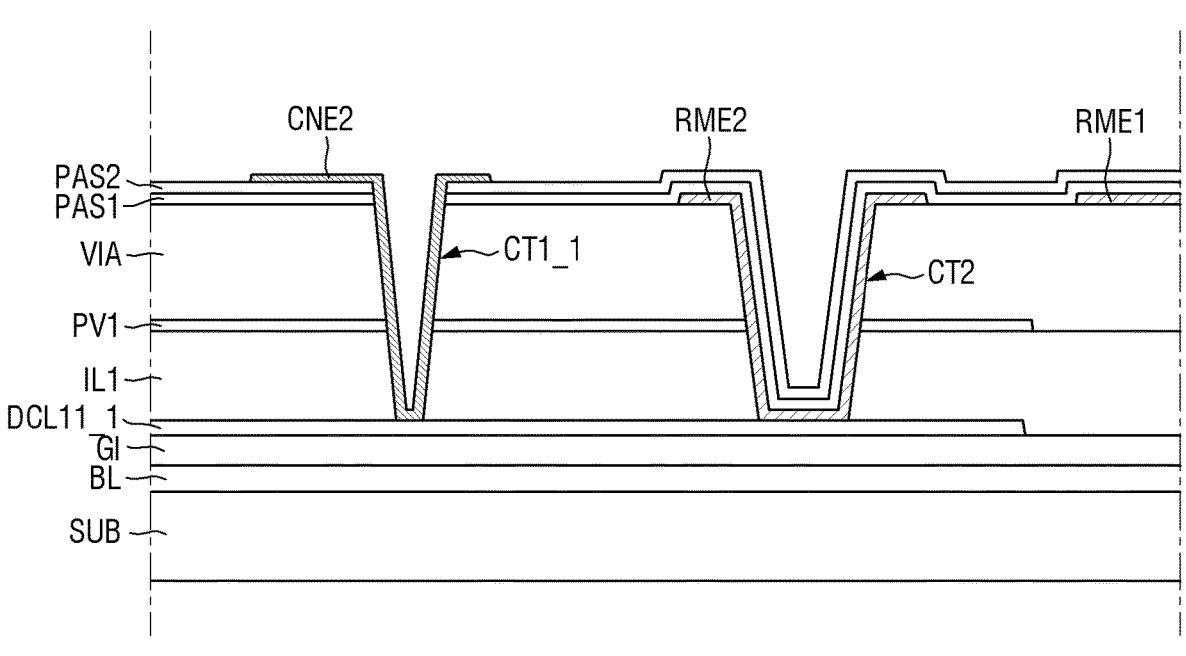
FIGS. 24 and 25 are schematic cross-sectional views of a display device according to another embodiment of the disclosure.
Figure 24:
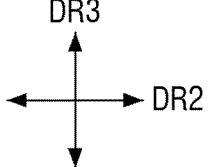
Figure 25:
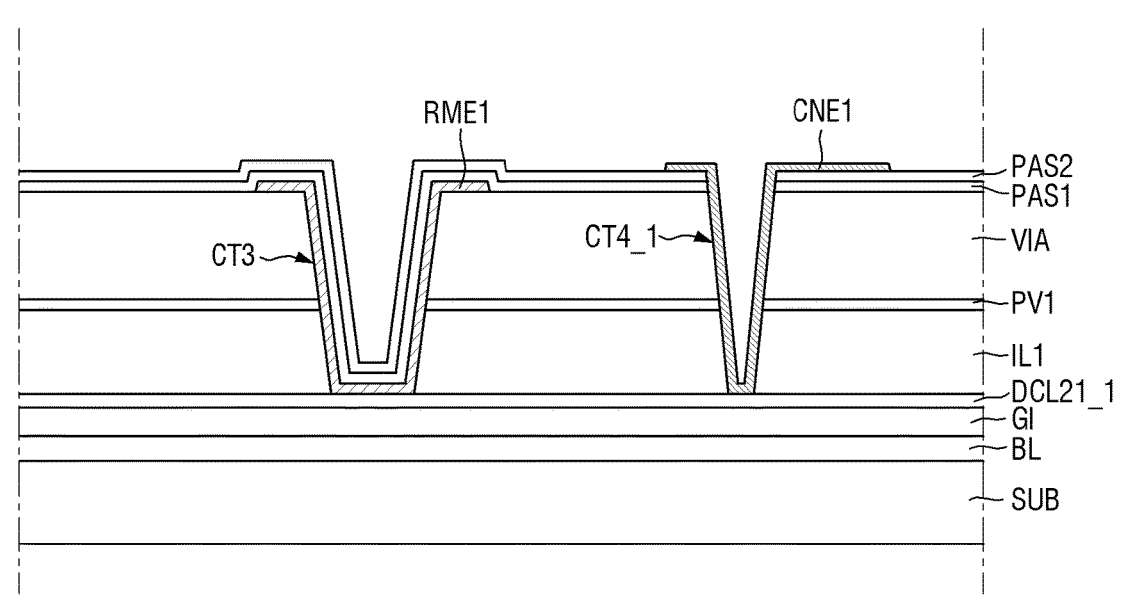
Figure 25:
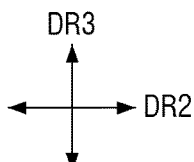

FIGS. 24 and 25 are schematic cross-sectional views of a display device according to another embodiment of the disclosure.

Referring to FIGS. 24 and 25, the display device of FIGS. 24 and 25 differs from the display device of FIGS. 7 and 8 in that a second electrode RME2 and a second connecting electrode CNE2 may be directly connected to a 1-1th connecting conductive pattern DCL11_1 through a second contact hole CT2 and a first contact hole CT1_1, respectively. The first contact hole CT1_1 may have a same cross-sectional structure as the second contact hole CT2. The display device of FIGS. 24 and 25 may also differ from the display device of FIGS. 7 and 8 in that a first electrode RME1 and a first connecting electrode CNE1 are directly connected to a 2-1th connecting conductive pattern DCL21_1 through a third contact hole CT3 and a fourth contact hole CT4_1, respectively. The fourth contact hole CT4_1 may have a same cross-sectional structure as the third contact hole CT3.

Figure 26:
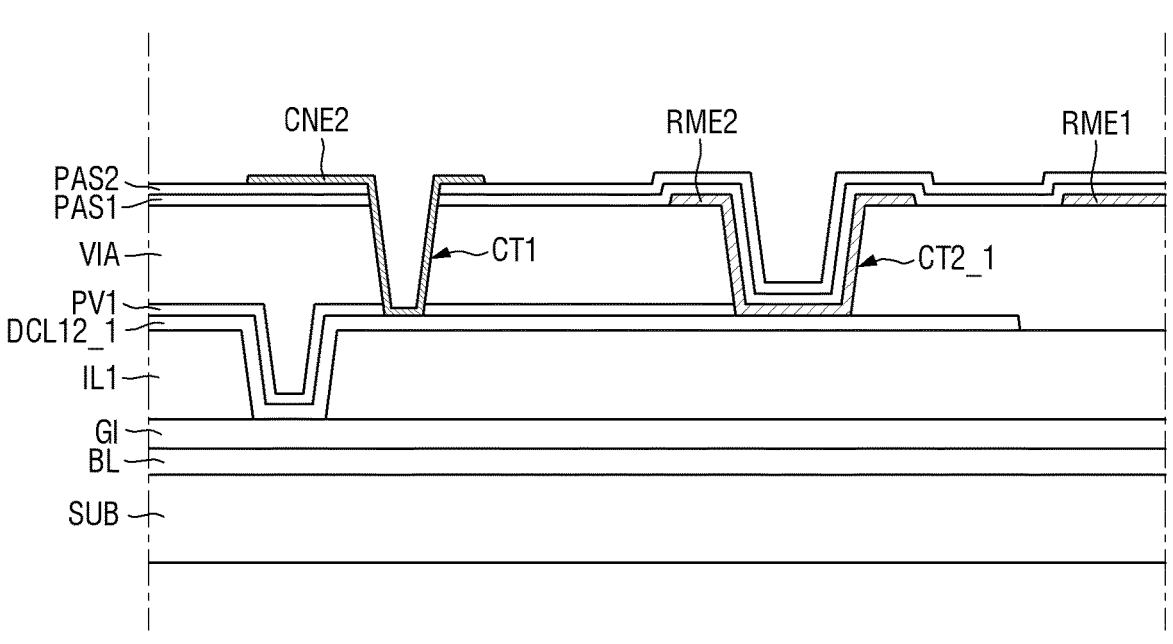
FIGS. 26 and 27 are schematic cross-sectional views of a display device according to another embodiment of the disclosure.
Figure 26:
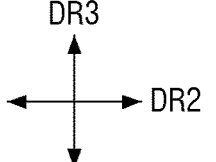
Figure 27:
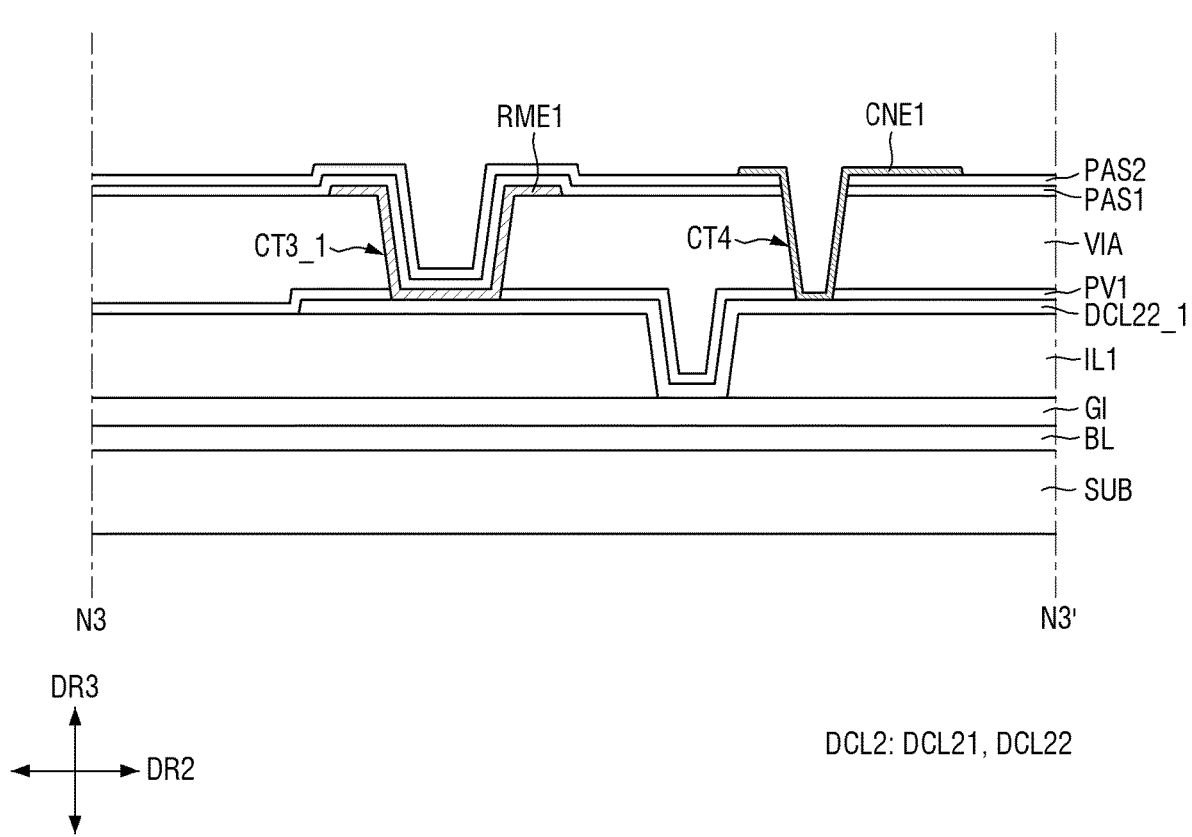

FIGS. 26 and 27 are schematic cross-sectional views of a display device according to another embodiment of the disclosure.

Referring to FIGS. 26 and 27, the display device of FIGS. 26 and 27 differs from the display device of FIGS. 7 and 8 in that a second electrode RME2 and a second connecting electrode CNE2 may be directly connected to a 1-2th connecting conductive pattern DCL12_1 through a second contact hole CT2_1 and a first contact hole CT1, respectively. The second contact hole CT2_1 may have a same cross-sectional structure as the first contact hole CT1. The display device of FIGS. 26 and 27 may also differ from the display device of FIGS. 7 and 8 in that a first electrode RME1 and a first connecting electrode CNE1 are directly connected to a 2-2th connecting conductive pattern DCL22_1 through a third contact hole CT3_1 and a fourth contact hole CT4, respectively. The third contact hole CT3_1 may have a same cross-sectional structure as the fourth contact hole CT4.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:
1. A display device comprising:
a first conductive layer on a substrate including gate electrodes of transistors and a 1-1th connecting conductive pattern and a 2-1th connecting conductive pattern;
a second conductive layer on the first conductive layer including source electrodes and drain electrodes of the transistors and a 1-2th connecting conductive pattern and a 2-2th connecting conductive pattern;
bank patterns on the second conductive layer, extending in a first direction and a second direction intersecting each other, surrounding subpixels, and including a first bank pattern and second bank patterns;
a first electrode on the first bank pattern, the first electrode being disposed in each of the subpixels to extend in the first direction;
second electrodes on the second bank patterns, the second electrodes being spaced apart from each other in the second direction with the first electrode being disposed between the second electrodes, and extending in the first direction;
light-emitting elements disposed on the first electrode and the second electrodes and including first light-emitting elements and second light-emitting elements;
a first connecting electrode disposed on the first electrode and electrically contacting the first light-emitting elements; and
a second connecting electrode disposed on the second electrodes and electrically contacting the second light-emitting elements, wherein
the first electrode is directly connected to the 2-1th connecting conductive pattern through a first contact hole, and
the second electrodes are directly connected to the 1-1th connecting conductive pattern through second contact holes,
the first connecting electrode is directly connected to the 2-2th connecting conductive pattern through a third contact hole.
2. The display device of claim 1, wherein the first conductive layer includes copper (Cu).
3. The display device of claim 2, wherein the 1-1th and 2-1th connecting conductive patterns include copper (Cu).
4. The display device of claim 1, wherein
the second connecting electrode is directly connected to the 1-2th connecting conductive pattern through a fourth contact hole.

5. The display device of claim 4, wherein the second conductive layer and the first conductive layer include a same material.

6. The display device of claim 5, wherein the 1-2th and 2-2th connecting conductive patterns include copper (Cu).

7. The display device of claim 4, further comprising:

an interlayer insulating layer on the first conductive layer; and a passivation layer on the interlayer insulating layer and the second conductive layer.

8. The display device of claim 7, further comprising:

a via layer between the second conductive layer and the first electrode and between the second conductive layer and the second electrodes.

9. The display device of claim 8, wherein the first contact hole and the second contact holes penetrate the via layer, the passivation layer, and the interlayer insulating layer.

10. The display device of claim 9, further comprising:

a first insulating layer on the first electrode and the second electrodes; and a second insulating layer on the first insulating layer.

11. The display device of claim 10, wherein the third and fourth contact holes penetrate the first insulating layer, the second insulating layer, the via layer, and the passivation layer.

12. The display device of claim 4, wherein the 1-1th and 1-2th connecting conductive patterns are directly connected to each other.

13. The display device of claim 12, wherein the 2-1th and 2-2th connecting conductive patterns are directly connected to each other.

14. The display device of claim 4, wherein a low-potential voltage is applied to the 1-1th connecting conductive pattern, and a high-potential voltage is applied to the 2-1th connecting conductive pattern.

15. A method of manufacturing a display device, comprising:

forming a first conductive layer including gate electrodes of transistors and 1-1th and 2-1th connecting conductive patterns, on a substrate;

forming a second conductive layer including source electrodes and drain electrodes of the transistors and 1-2th and 2-2th connecting conductive patterns, on the first conductive layer;

forming bank patterns, extending in first and second directions intersecting each other, surrounding subpixels, and including a first bank pattern and second bank patterns, on the second conductive layer;

forming a first electrode disposed in each of the subpixels to extend in the first direction, and second electrodes spaced apart from each other in the second direction with the first electrode being disposed between the second electrodes and extending in the first direction, on the first bank pattern;

forming light-emitting elements including first light-emitting elements and second light-emitting elements, on the first electrode and the second electrodes;

forming a first connecting electrode electrically contacting the first light-emitting elements, on the first electrode; and forming a second connecting electrode electrically contacting the second light-emitting elements, on the second electrodes, wherein the first electrode is directly connected to the 2-1th connecting conductive pattern through a first contact hole, and the second electrodes are directly connected to the 1-1th connecting conductive pattern through second contact holes, the first connecting electrode is directly connected to the 2-2th connecting conductive pattern through a third contact hole.

16. The method of claim 15, wherein the 1-1th and 2-1th connecting conductive patterns include copper (Cu).

17. The method of claim 15, wherein the second connecting electrode is directly connected to the 1-2th connecting conductive pattern through a fourth contact hole.

18. The method of claim 17, wherein the second conductive layer and the first conductive layer include a same material.

19. The method of claim 18, wherein the 1-1th and 1-2th connecting conductive patterns are directly connected to each other, and the 2-1th and 2-2th connecting conductive patterns are directly connected to each other.

20. The method of claim 19, wherein a low-potential voltage is applied to the 1-1th connecting conductive pattern, and a high-potential voltage is applied to the 2-1th connecting conductive pattern.

* * * * *